(12) United States Patent
Endo

(10) Patent No.: US 8,785,933 B2
(45) Date of Patent: Jul. 22, 2014

(54) SEMICONDUCTOR DEVICE

(75) Inventor: Yuta Endo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 93 days.

(21) Appl. No.: 13/402,938

(22) Filed: Feb. 23, 2012

(65) Prior Publication Data

US 2012/0223311 A1    Sep. 6, 2012

(30) Foreign Application Priority Data

Mar. 4, 2011    (JP) .................................. 2011-047759

(51) Int. Cl.
    *H01L 29/786*    (2006.01)

(52) U.S. Cl.
    USPC ..................................... 257/57; 257/E29.273

(58) Field of Classification Search
    USPC .......................................................... 257/57
    See application file for complete search history.

(56) References Cited

U.S. PATENT DOCUMENTS

| | | | |
|---|---|---|---|
| 5,528,032 | A | 6/1996 | Uchiyama |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,841,797 | B2 | 1/2005 | Isobe et al. |
| 6,884,668 | B2 | 4/2005 | Yamazaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Kim, IEDM 05: Technical Digest of International Electron Devices Meeting, "Technology for sub-50nm DRAM and NAND Flash Manufacturing," pp. 333-336, Dec. 5, 2005.

(Continued)

*Primary Examiner* — Zandra Smith
*Assistant Examiner* — Lawrence Tynes, Jr.
(74) *Attorney, Agent, or Firm* — Eric J. Robinson; Robinson Intellectual Property Law Office, P.C.

(57) ABSTRACT

A semiconductor device of the present invention includes a gate electrode which includes a pair of first protrusions and a second protrusion provided between the pair of first protrusions; a gate insulating film covering the gate electrode; a semiconductor film which is in contact with the gate insulating film and overlaps with the pair of first protrusions and the second protrusion; and a pair of electrodes which is in contact with the semiconductor film and overlaps with the pair of first protrusions. The side edges of the semiconductor film are on the outer sides than the top surfaces of the pair of first protrusions in the direction of the channel width of the semiconductor film. The side edges of the pair of electrodes are on the outer sides than the top surfaces of the pair of first protrusions in the direction of the channel width of the semiconductor film.

15 Claims, 25 Drawing Sheets

(56) References Cited

U.S. PATENT DOCUMENTS

| | | | |
|---|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,867,791 B2 | 1/2011 | Ohnuma et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0171085 A1* | 11/2002 | Suzawa et al. ............ 257/72 |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206342 A1* | 8/2009 | Hosoya et al. ............ 257/72 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-110096 | 4/1993 |
| JP | 05-110096 A | 4/1993 |
| JP | 05-251705 A | 9/1993 |
| JP | 06-275697 A | 9/1994 |
| JP | 08-264794 A | 10/1996 |
| JP | 11-505127 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-245371 A | 9/2006 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

(56) References Cited

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al,, "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

FIG. 2A
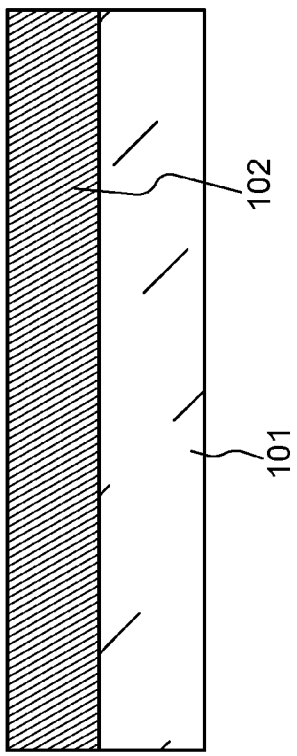
FIG. 2B
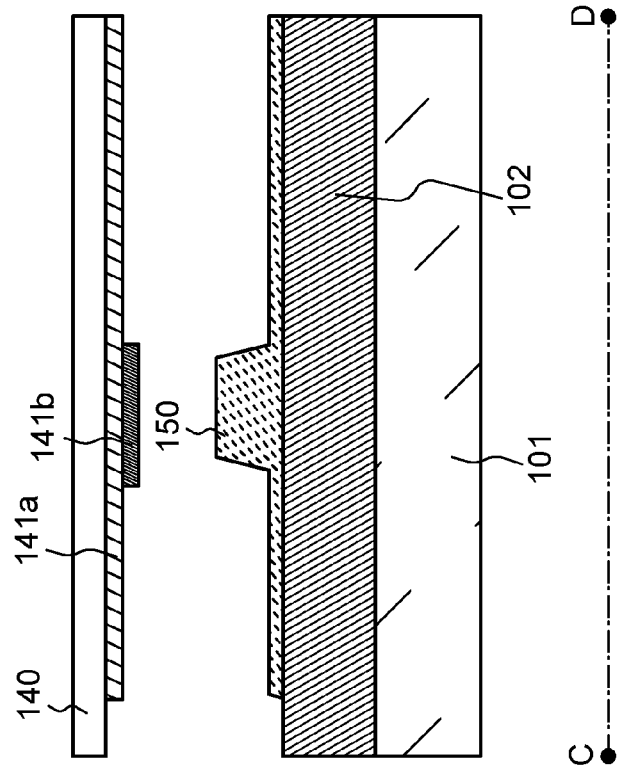
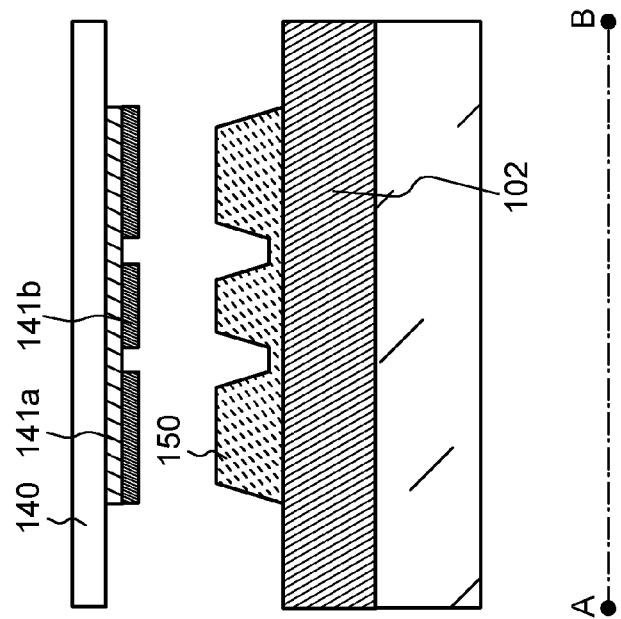

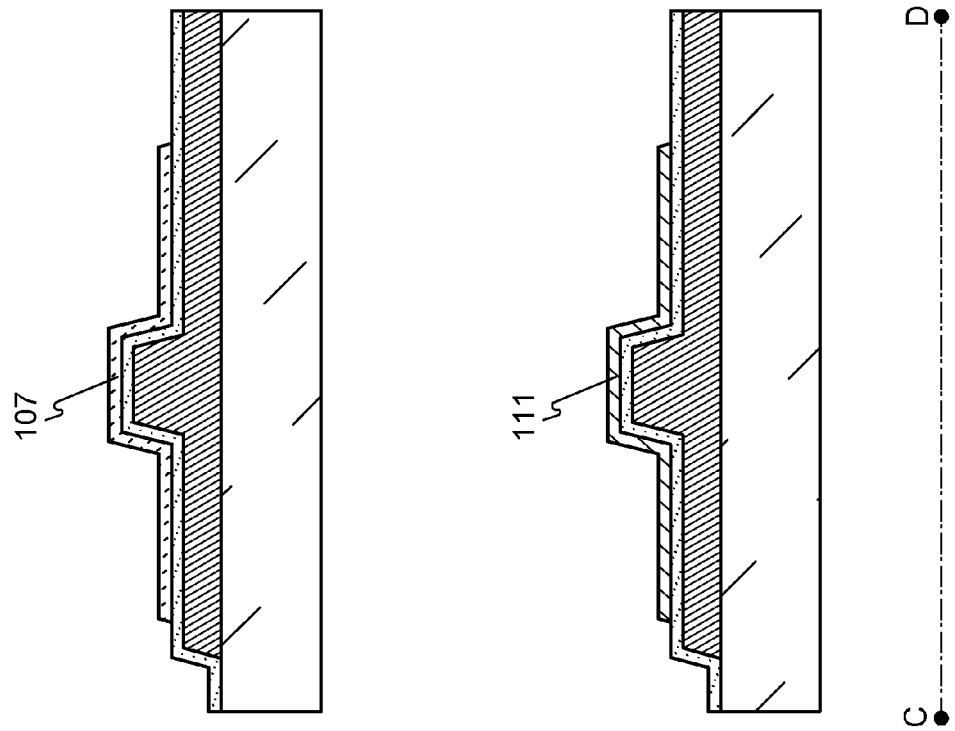

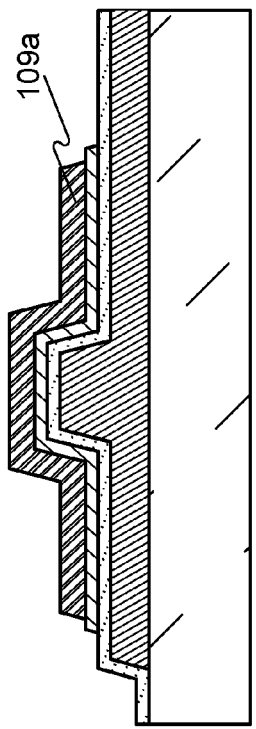
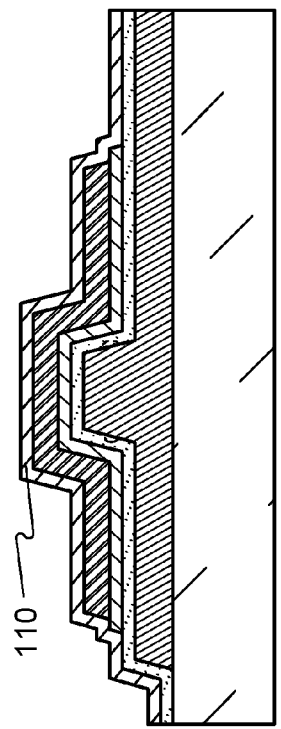
FIG. 8A
FIG. 8B
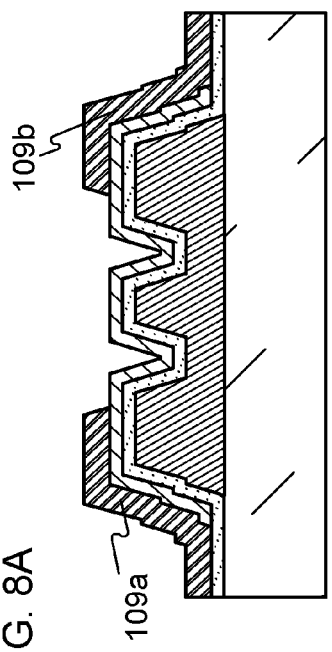
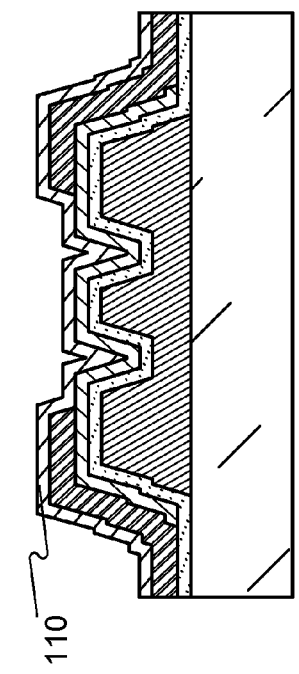

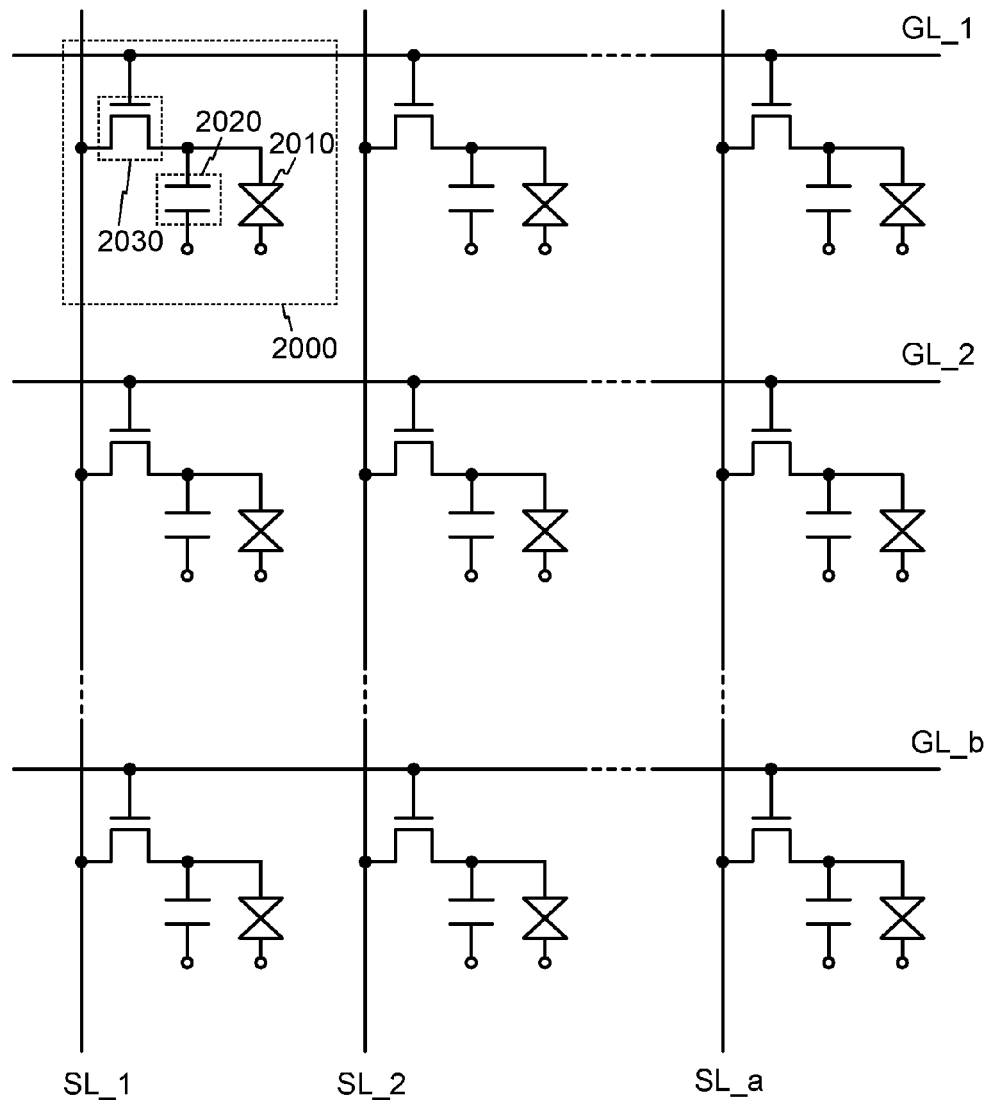

SEMICONDUCTOR DEVICE

BACKGROUND OF THE INVENTION

1. Field of the Invention

The present invention relates to a semiconductor device which includes an oxide semiconductor film.

In this specification, the semiconductor device refers to all the elements and the devices that operate by utilizing semiconductor characteristics. A typical example of the element is a transistor. A display device, a semiconductor circuit, and an electric device each of which includes the transistor are included in the semiconductor device in its category.

2. Description of the Related Art

A transistor has switching characteristics and therefore is used as a switching element of a pixel in a liquid crystal display device, a light-emitting display device, or the like. The switching characteristics of the transistor are utilized not only in a liquid crystal display device or a light-emitting display device but also in a semiconductor memory element.

For example, a dynamic random access memory (DRAM) which is one of semiconductor memory devices has a memory cell including a transistor and a capacitor. The transistor needs to be miniaturized for the purpose of reduction of the memory cell size in order to improve the integration degree of the semiconductor integration circuit without an increase in size of chips in the DRAM.

When a transistor is miniaturized, the channel length thereof is extremely shortened. In such a case, fluctuation in electric characteristics of the transistor such as the negative shift in the threshold voltage might occur. When a transistor is miniaturized, it is important to suppress this phenomenon called a short-channel effect to miniaturization of a transistor.

Because of the short-channel effect, a leakage current due to a punch-through phenomenon is likely to flow in a transistor whose channel length is extremely shortened; as a result, the transistor does not function as a switching element in some cases. In order to prevent the leakage current from flowing, a silicon substrate may be doped with an impurity at high concentration. However, this is not an appropriate solution to the problem because it makes a junction leakage current likely to flow between a source and the silicon substrate or between a drain and the silicon substrate and eventually causes a deterioration of memory retention characteristics.

Against such a problem, a method has been considered for maintaining an effective channel length long enough by forming a three-dimensional transistor in the memory cell in order to prevent a short-channel effect. An example is a structure in which a U-shaped vertically long groove is formed in a region where a channel portion of a transistor is formed, a gate insulating film is formed along a wall surface in the vertically long groove, and a gate electrode is formed so as to fill the vertically long groove (see Non-Patent Document 1).

In a transistor with such a structure in the channel portion, current which flows from a source to a drain via the vertically long groove portion; therefore, an effective channel length is longer than an apparent channel length which is a distance between the source electrode and the drain electrode in the transistor seen from the top. In this manner, the transistor can be reduced in size and the short-channel effect thereof can be suppressed.

REFERENCE

Non-Patent Document

[Non-Patent Document 1] Kinam Kim, "Technology for sub-50 nm DRAM and NAND Flash Manufacturing", International Electron Devices Meeting 2005, IEDM Technical Digest, Dec. 2005, pp. 333-336

SUMMARY OF THE INVENTION

It is effective that the effective channel length is lengthened in order to suppress the short-channel effect. However, a transistor with a U-shaped vertically long groove needs to be subjected to an additional photolithography step to form a vertically long groove, that is, there are problems in the manufacturing cost and yield.

Further, in the case where a gate insulating film or the like is formed in a vertically long groove, the amount of deposition of the film increases near the entrance of the groove when a sputtering method or a plasma chemical vapor deposition (CVD) method is employed; therefore, the groove is embedded with a deposition material in some cases. Accordingly, it is necessary to select a deposition method which provides excellent coverage; specifically, it is a problem that the method is limited to a method such as an atomic layer deposition (ALD) method whose cost is relatively expensive or a thermal oxidation method which can be used only for a silicon wafer or the like.

An object of one embodiment of the present invention is to provide a transistor which has a smaller size and a longer effective channel length, without having a vertically long groove.

The size of the transistor is reduced and the effective channel length thereof is lengthened in order to suppress the short-channel effect, whereby the off-state current or the leakage current of the transistor can be reduced. However, the off-state current thereof is also reduced.

When the transistor is used for a semiconductor memory device, it is useful to improve the switching characteristics of a transistor such as on/off ratio. For example, the range of current values which can be read by a reading circuit formed in the semiconductor memory device can be increased. Accordingly, it is effective that the on/off ratio of the transistor in which the effective channel length is lengthened in order to suppress the short-channel effect is made to be sufficiently high by increasing the on-state current.

An object of one embodiment of the present invention is to provide a transistor which has a smaller size and a higher on-state current and a transistor which has an excellent switching characteristic.

A transistor which has a smaller size and a longer effective channel length is a transistor in which, a distance (corresponding to the effective channel length) of a carrier path flowing from a source to a drain is longer than a distance (corresponding to the apparent channel length) between a pair of electrodes which are a source electrode and a drain electrode when the transistor is seen from the top.

In order to make the effective channel length of the bottom-gate transistor to be manufactured longer than the apparent channel length thereof, a gate electrode which includes protrusions which extends in the direction of the channel width of the semiconductor film is used as the gate electrode in the transistor.

In order to increase the on-state current of the transistor, the channel width which corresponds to a width of a pair of electrodes serving as a source electrode and a drain electrode is increased. When the channel width is increased, the size of the transistor needs to be reduced.

As the gate electrode of the bottom-gate transistor to be manufactured, a gate electrode which includes a protrusion extending in the direction of the channel width of the semiconductor film and a pair of protrusions facing each other with the protrusion extending in the direction of the channel width provided therebetween is used. Thus, the effective channel length is lengthened. Further, the effective channel width which functions in operation of the transistor can be longer than the apparent channel width which corresponds to a width of a pair of electrodes serving as a source electrode and a drain electrode when the transistor is seen from the top.

Note that "the channel width of a semiconductor film" can also be referred to as "the channel width of a transistor" because a channel region of the transistor is formed in the semiconductor film included in the transistor. Further, "the channel length of a semiconductor film" can also be referred to as "the channel length of a transistor". In some cases, "the direction of the channel width of a semiconductor film" or "the direction of the channel width of a transistor" is simply referred to as "the direction of the channel width", and "the direction of the channel length of a semiconductor film" or "the direction of the channel length of a transistor" is simply referred to as "the direction of the channel length".

One embodiment of the present invention is a semiconductor device including a gate electrode which includes a pair of first protrusions and a second protrusion provided between the pair of first protrusions; a gate insulating film covering the gate electrode; a semiconductor film which is in contact with the gate insulating film and overlaps with the pair of first protrusions and the second protrusion; and a pair of electrodes which is in contact with the semiconductor film and overlaps with the pair of first protrusions. The side edges of the semiconductor film are on the outer sides than the top surfaces of the pair of first protrusions in the direction of the channel width of the semiconductor film. The side edges of the pair of electrodes are on the outer sides than the top surfaces of the pair of first protrusions in the direction of the channel width of the semiconductor film.

A plurality of pairs of protrusions facing each other with the protrusion extending in the direction of the channel width provided therebetween is provided over the gate electrode, so that the effective channel width can be further longer than the apparent channel width which corresponds to the width of a pair of electrodes when the transistor is seen from the top.

Another embodiment of the present invention is a semiconductor device in which a plurality of pairs of first protrusions is provided in the direction of the channel width of a semiconductor film.

In the case where the plurality of pairs of first protrusions is provided, one of the side edges of the semiconductor film and the pair of electrodes in the direction of the channel width may be provided over top surfaces of one pair of first protrusions, and the other of the side edges of the semiconductor film and the pair of electrodes in the direction of the channel width may be provided over top surfaces of a pair of first protrusions which is different from the one pair of first protrusions.

Another embodiment of the present invention is a semiconductor device including a gate electrode which includes a plurality of pairs of first protrusions and a second protrusion provided between the plurality of pairs of first protrusions; a gate insulating film covering the gate electrode; a semiconductor film which is in contact with the gate insulating film and overlaps with the second protrusion; and a pair of electrodes which is in contact with the semiconductor film and overlaps with the plurality of pairs of first protrusions. One of the side edges of the semiconductor film in the direction of the channel width may be provided over top surfaces of one pair of first protrusions, and the other of the side edges of the semiconductor film in the direction of the channel width may be provided over top surfaces of a pair of first protrusions which is different from the one pair of first protrusions. One of the side edges of the pair of electrodes in the direction of the channel width may be provided over top surfaces of one pair of first protrusions, and the other of the side edges of the pair of electrodes in the direction of the channel width may be provided over top surfaces of a pair of first protrusions which is different from the one pair of first protrusions.

A plurality of protrusions extending in the direction of the channel width is provided between the pair of protrusions, so that the effective channel length which functions in operation of the transistor can be further longer than the apparent channel length.

Another embodiment of the present invention is a semiconductor device in which a plurality of second protrusions is provided in the direction of the channel length of a semiconductor film.

Further, in the above embodiment, a gate electrode can be considered to include one region in which the pair of first protrusions and the second protrusion are formed and the other region in which the pair of first protrusions and the second protrusion are not formed. The two regions may be formed using different conductive materials. In that case, a difference in work function between the two regions is preferably less than or equal to 0.6 eV.

Another embodiment of the present invention is a semiconductor device including a gate electrode which includes a first region including a pair of first protrusions and a second protrusion and a second region which is not the first region. The first region and the second region are formed using different conductive materials, and the difference in work function between the conductive material forming the first region and the conductive material forming the second region is less than or equal to 0.6 eV.

Not only a bottom-gate transistor but also a top-gate transistor can have suppressed short-channel effect and a higher on-state current by including a structure which has an insulating surface and includes a protrusion extending in the direction of the channel width and a pair of protrusions facing each other with the protrusion extending in the direction of the channel width provided therebetween.

That is, another embodiment of the present invention is a semiconductor device including a structure which has an insulating surface and includes a pair of first protrusions and a second protrusion provided between the pair of first protrusions; a semiconductor film which is in contact with the pair of first protrusions and the second protrusion; a pair of electrodes which is in contact with the semiconductor film and overlaps with the pair of first protrusions; a gate insulating film covering the structure, the semiconductor film, and the pair of electrodes; and a gate electrode which is in contact with the gate insulating film and is provided between the pair of electrodes. The side edges of the semiconductor film are on the outer sides than the top surfaces of the pair of first protrusions in the direction of the channel width of the semiconductor film. The side edges of the pair of electrodes are on the outer sides than the top surfaces of the pair of first protrusions in the direction of the channel width of the semiconductor film.

In the case of the top-gate structure, the structure which has an insulating surface includes a plurality of pairs of protrusions facing each other with the protrusion extending in the direction of the channel width provided therebetween, so that the effective channel width which functions in operation of the transistor can be further longer than the apparent channel width which corresponds to the width of a pair of electrodes when the transistor is seen from the top.

In the case where the structure which has an insulating surface includes the plurality of pairs of first protrusions, one of the side edges of the semiconductor film and the pair of electrodes in the direction of the channel width may be provided over top surfaces of one pair of first protrusions, and the other of the side edges of the semiconductor film and the pair of electrodes in the direction of the channel width may be provided over top surfaces of a pair of first protrusions which is different from the one pair of first protrusions.

In the above top-gate transistor, a plurality of protrusions extending in the direction of the channel width is provided between the pair of protrusions, so that the effective channel length can be further longer than the apparent channel length.

The structure which has an insulating surface used for the top-gate transistor preferably includes silicon oxide, silicon oxynitride, silicon nitride oxide, silicon nitride, aluminum oxide, aluminum oxynitride, aluminum nitride oxide, aluminum nitride, or the like.

The effective channel width and the effective channel length are preferably three times or more the apparent channel width and the apparent channel length, respectively, in both the bottom-gate transistor and the top-gate transistor.

In the bottom-gate transistor according to one embodiment of the present invention, the gate electrode which includes a protrusion extending in the direction of the channel width and the pair of protrusions facing each other with the protrusion extending in the direction of the channel width provided therebetween can be formed using two photomasks by performing a photolithography step twice and an etching step twice.

A method different from the above is a method in which a resist mask having regions with different thicknesses is formed over a conductive film to be a gate electrode, and etching is performed on the resist mask. The thicknesses correspond to a region which functions as a gate electrode, a region in which a protrusion extending in the direction of the channel width is formed, and a region in which a pair of protrusions facing each other with the protrusion extending in the direction of the channel width provided therebetween is formed. In this manner, the gate electrode which includes the protrusion extending in the direction of the channel width and the pair of protrusions which faces each other with the protrusion extending in the direction of the channel width provided therebetween can be formed. The resist mask having regions with different thicknesses can be formed using a multi-tone mask. Therefore, the gate electrode can be formed with a photo mask, and the number of photolithography steps can be reduced; therefore, the gate electrode can be formed without an increase in number of photolithography steps.

In the top-gate transistor, a structure which has an insulating surface and includes a protrusion extending in the direction of the channel width and a pair of protrusions facing each other with the protrusion extending channel width direction provided therebetween can be formed by the method using a multi-tone mask.

The semiconductor film used for the transistor is preferably an oxide semiconductor film. The band gap of an oxide semiconductor film is larger than that of a silicon semiconductor film, and the oxide semiconductor film is used for the transistor so that the off-state current can be reduced. Accordingly, the high on/off ratio of the transistor is easily obtained. Further, in the case where the transistor is used for a memory cell of the semiconductor memory device, a leakage current of the memory cell can be reduced.

With one embodiment of the present invention, a transistor which has a smaller size and a longer effective channel length without using a vertically long groove can be provided.

According to one embodiment of the present invention, the short-channel effect can be suppressed; accordingly, a transistor which has a smaller size and a higher on-state current and a transistor which has an excellent switching characteristic can be provided. Therefore, a semiconductor device with suppressed short-channel effect and high integration can be provided.

BRIEF DESCRIPTION OF THE DRAWINGS

In the accompanying drawings:

FIGS. 2A and 2B are cross-sectional views which show an example of a manufacturing method for a semiconductor device according to one embodiment of the present invention;

FIGS. 7A and 7B are cross-sectional views which show an example of a manufacturing method for a semiconductor device according to one embodiment of the present invention;

FIGS. 8A and 8B are cross-sectional views which show an example of a manufacturing method for a semiconductor device according to one embodiment of the present invention;

FIG. 23 is a circuit diagram showing an example of a display device including a transistor according to one embodiment of the present invention;

DETAILED DESCRIPTION OF THE INVENTION

Figure 1A:
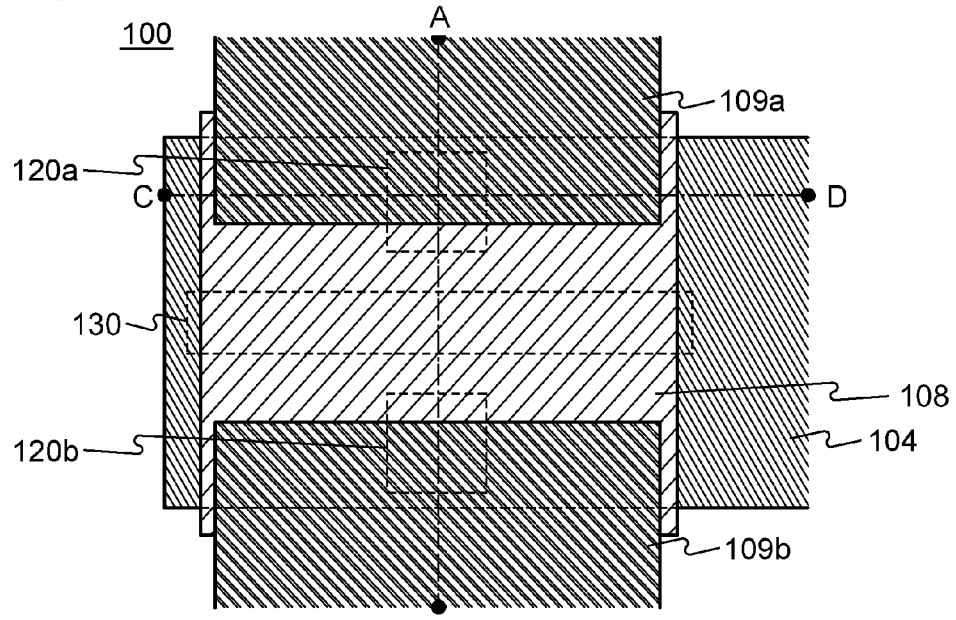
FIGS. 1A to 1C are a top view and cross-sectional views, respectively which show an example of a semiconductor device according to one embodiment of the present invention.

Embodiments of the present invention are described below with reference to the accompanying drawings. However, the present invention is not limited to the description below, and those skilled in the art appreciate that a variety of modifications can be made to the modes and details without departing from the spirit and scope of the invention. Therefore, the present invention should not be construed as being limited to the description in the following embodiments. Note that the same portions or portions having a similar function in the structure of the present invention described below are denoted by the same reference numerals in common among different drawings and repetitive description thereof are omitted.

Note that in each drawing described in this specification, the size, the film thickness, or the region of each structure is exaggerated for clarity in some cases. Therefore, embodiments of the present invention are not limited to such scales.

In this specification, the term "film" is used to denote the one which is entirely formed over a surface by a CVD method (including a plasma CVD method and the like), a sputtering method, or the like and the one which is entirely formed over a surface and is then subjected to treatment according to a manufacturing process of a semiconductor device.

Further, the terms such as "first", "second", and "third" used in this specification are used just to avoid confusion of structural elements and do not mean limitation of the number of the structural elements. Therefore, for example, the term "first" can be replaced with the term "second", "third", or the like as appropriate.

Note that in this specification, "on-state current" is current which flows between a source and a drain when a transistor is in a conducting state. For example, in the case of an n-channel thin film transistor, the on-state current is current which flows between a source and a drain when the gate voltage of the transistor is higher than the threshold voltage thereof. In addition, "off-state current" is current which flows between a source and a drain without intention when a transistor is in a non-conducting state. For example, in the case of an n-channel thin film transistor, the off-state current is current which flows between a source and a drain when the gate voltage of the transistor is lower than the threshold voltage thereof. Note that here, "gate voltage" refers to a potential difference between a source and a gate when the potential of the source is used as a reference potential. Note that "on/off ratio" is ratio of the on-state current to the off-state current of a transistor.

Note that, functions of "source" and "drain" may become switched in the case where a direction of a current flow is changed during circuit operation, for example. Therefore, the terms "source" and "drain" can be used to denote the drain and the source, respectively, in this specification.

[Embodiment 1]

In this embodiment, a transistor 100 according to one embodiment of the present invention is described with reference to FIGS. 1A to 1C.

FIG. 1A is a top view of the transistor 100.

The transistor 100 having a bottom gate structure includes a gate electrode 104 which includes, over a substrate 101, a pair of first protrusions 120a and 120b and a second protrusion 130 provided between the pair of first protrusions 120a and 120b; a gate insulating film 105 covering the gate electrode 104; a semiconductor film 108 which is in contact with the gate insulating film 105 and overlaps with the pair of first protrusions 120a and 120b and the second protrusion 130; and a pair of electrodes 109a and 109b which is in contact with the semiconductor film 108 and overlaps with the pair of first protrusions 120a and 120b. Note that the gate insulating film 105 is not shown in FIG. 1A for convenience.

The pair of first protrusions 120a and 120b of the gate electrode 104 faces each other with the second protrusion 130 extending in the direction of the channel width provided therebetween.

In the direction of the channel width, the side edges of the semiconductor film 108 are on the outer sides than the top surfaces of the pair of first protrusions 120a and 120b of the gate electrode 104.

Further, in the direction of the channel width, the side edges of the pair of electrodes 109a and 109b are on the outer sides than the top surfaces of the pair of first protrusions 120a and 120b of the gate electrode 104.

Figure 1B:
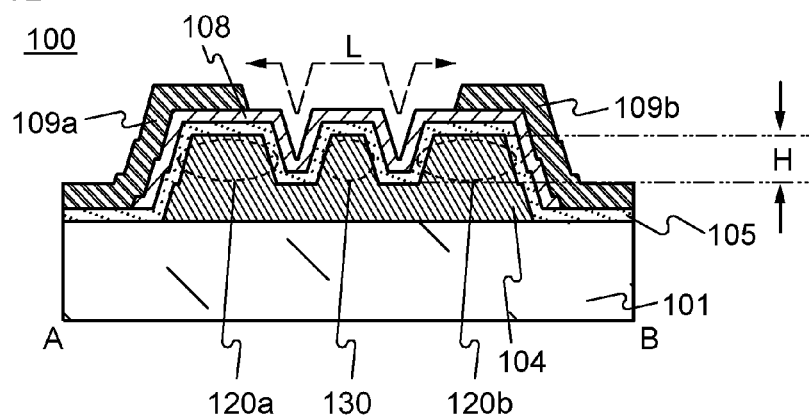

FIG. 1B is a cross-sectional view of the transistor 100 along dashed-dotted line A-B in FIG. 1A.

The semiconductor film 108 is formed along the shape of the pair of first protrusions 120a and 120b and the second protrusion 130 of the gate electrode 104. Accordingly, a three-dimensional channel region is formed in the transistor 100. Further, an effective channel length L which functions in operation of the transistor 100 is longer than an apparent channel length which corresponds to the distance between the pair of electrodes 109a and 109b in FIG. 1A by at least the height H of each of the first protrusion 120a, the first protrusion 120b, and the second protrusion 130 (see FIG. 1B).

The height H of each of the first protrusion 120a, the first protrusion 120b, and the second protrusion 130 corresponds to, in a perpendicular line that is drawn from top surfaces of the pair of first protrusions 120a and 120b and the second protrusion 130 perpendicularly to a bottom surface of the gate electrode 104, a distance between the top surfaces of the pair of first protrusions 120a and 120b and the second protrusion 130 and the top surface of a region where neither the pair of first protrusions 120a and 120b nor the second protrusion 130 of the gate electrode 104 is provided.

Figure 1C:
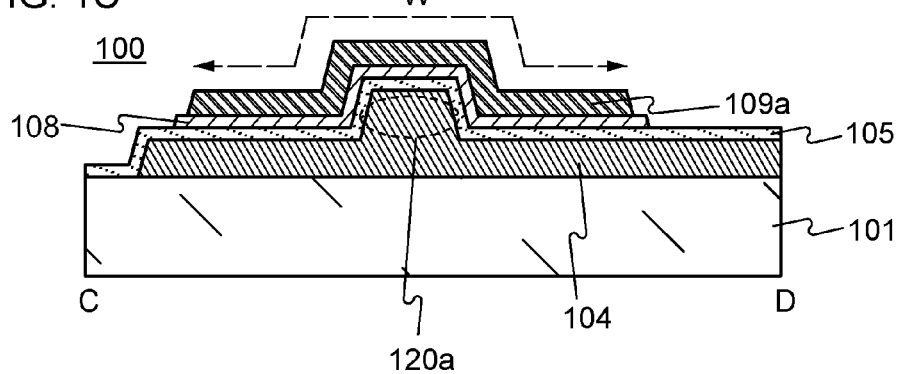

FIG. 1C is a cross-sectional view of the transistor 100 along dashed-dotted line C-D in FIG. 1A.

The transistor 100 in the cross section C-D includes the substrate 101; the gate electrode 104 which includes the first protrusion 120a which is one of the pair of first protrusions 120a and 120b; the gate insulating film 105 covering the gate electrode 104; the semiconductor film 108 which is in contact with the gate insulating film 105 and overlaps with the first protrusion 120a; and the electrode 109a which is one of the pair of electrodes 109a and 109b which is in contact with the semiconductor film 108 and overlaps with the pair of first protrusions 120a and 120b.

The effective channel length L is lengthened, whereby the on-state current of the transistor is lowered. The semiconductor film 108 in the transistor 100 is formed along the shape of the pair of first protrusions 120a and 120b of the gate electrode 104. Accordingly, a three-dimensional channel region is formed in the transistor 100. Further, an effective channel width W which functions in operation of the transistor 100 is longer than an apparent channel width which corresponds to the width between the pair of electrodes 109a and 109b in FIG. 1A by at least the height H of each of the first protrusion 120a and the first protrusion 120b (see FIG. 1C). In this manner, the transistor 100 can be reduced in size and on-state current thereof is increased.

The height H of each of the first protrusion 120a, the first protrusion 120b, and the second protrusion 130 is preferably three times or more, further preferably five times or more, still further preferably 10 times or more the apparent channel length. Further, the effective channel width W of the pair of first protrusions 120a and 120b and the second protrusion 130 is preferably three times or more, further preferably five times or more, still further preferably 10 times or more the apparent channel width. In order to make the preferable height and width, the height H of each of the first protrusion 120a, the first protrusion 120b, and the second protrusion 130 is selected. Note that the height of each of the first protrusion 120a and the first protrusion 120b is the same as the height of the second protrusion 130 because the pair of first protrusions 120a and 120b and the second protrusion 130 are formed in the same manufacturing process.

In this manner, the size of the transistor 100 is reduced and the influence caused by the short-channel effect such as the negative shift in the threshold voltage or the increase in off-state current can be suppressed because the effective channel length L of the transistor 100 is longer than the apparent channel length thereof.

That is, the effective channel length L of the transistor 100 is lengthened and the short-channel effect thereof can be suppressed. Further, the effective channel width W of the transistor 100 is lengthened and the on-state current thereof can be increased. Accordingly, the transistor 100 has excellent switching characteristics with sufficiently high on/off ratio.

Although the pair of first protrusions 120a and 120b and the second protrusion 130 shown in FIGS. 1A to 1C each have a frustum of pyramid shape, each may have a spindle shape. In other words, any shape may be used as long as the effective channel length L and the effective channel width W of the transistor 100 is longer than the apparent channel length and the apparent channel width, respectively, thereof. Further, the cross-sectional shape in the direction perpendicular to the height direction of the pair of first protrusions 120a and 120b and the second protrusion 130 may be a circular shape (including an elliptical shape) or a polygonal shape.

The cross section A-B and the cross section C-D of the pair of first protrusions 120a and 120b and the second protrusion 130 each have a trapezoidal shape. In the case where the pair of first protrusions 120a and 120b and the second protrusion 130 each have a frustum of pyramid shape, the pair of first protrusions 120a and 120b and the second protrusion 130 are preferable tapered in order to improve coverage with a film formed in the process of manufacturing the transistor 100 and prevent disconnection of the film.

Here, the second protrusion 130 provided to extend in the direction of the channel width of the gate electrode 104 is described.

It can be considered that the semiconductor film 108 includes the following two regions. The two regions indicates a region (1) which is formed along the shapes of the pair of first protrusions 120a and 120b and the second protrusion 130 and a region (2) which is formed along the shape of the second protrusion 130. In this case, the effective channel length formed in the region (2) is shorter than the effective channel length formed in the region (1).

For suppression of the short-channel effect by forming the effective channel length longer than the apparent channel length, the second protrusion 130 the shape of which the semiconductor film 108 is formed along makes more contribution than the pair of first protrusions 120a and 120b the shape of which the semiconductor film 108 is formed along. That is, the short-channel effects of the region (1) and the region (2) are both suppressed.

With the second protrusion 130 provided to extend in the direction of the channel width, as seen in FIG. 1A, even in the case where the length of the semiconductor film 108 in the direction of the channel width is longer than the length of the pair of first protrusions 120a and 120b in the direction of the channel width, the effective channel length can be longer than the apparent channel length in all the region of the semiconductor film 108, and the short-channel effect can be suppressed.

In other words, the choice of the size of the semiconductor film 108 can be extended because the second protrusion 130 is provided to extend in the direction of the channel width.

The structure of the transistor 100 is not limited to the structure shown in FIGS. 1A to 1C. For example, the transistor 100 has a structure as follows.

Figure 25A:
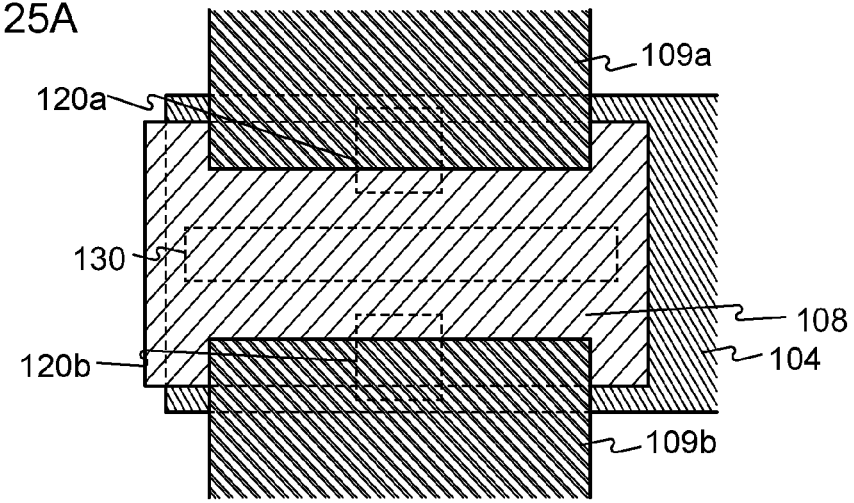
FIGS. 25A to 25C are top views each of which shows an example of a semiconductor device according to one embodiment of the present invention.

The region of the semiconductor film 108 is formed so as to overlap with the pair of first protrusions 120a and 120b and the second protrusion 130. That is, the transistor 100 in FIG. 1A has the structure in which the side edges of the semiconductor film 108 is on the outer sides than the side edges of the gate electrode 104 in the direction of the channel length and on the inner side than the side edges of the second protrusion 130 in the direction of the channel width; however, the transistor may have the structure in which one of the side edges of the semiconductor film 108 is on the inner side than a side edge of the gate electrode 104 in the direction of the channel length or on the outer sides than a side edge of the second protrusion 130 in the direction of the channel width (see FIG. 25A).

Figure 25B:
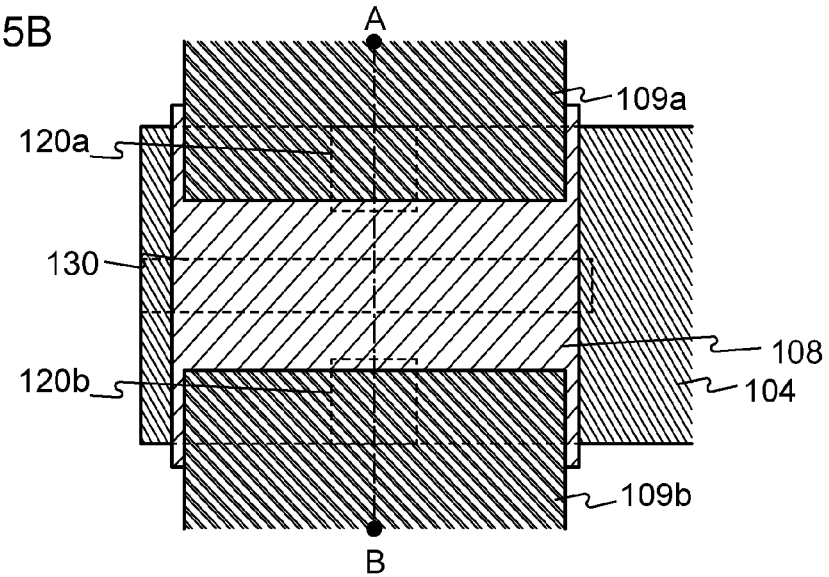

Further, the transistor may have a structure in which the side edge of the pair of first protrusions 120a and 120b is on the inner side than the side edge of the gate electrode 104 in the direction of the channel length and the side edge of the second protrusion 130 is on the inner side than the side edge of the gate electrode 104 in the direction of the channel width, and each one of the side edges of the first protrusion 120a, one of the side edges of the first protrusion 120b, and one of the side edges of the second protrusion 130 is a side edge of the gate electrode 104 (see FIG. 25B). The transistor 100 shown in FIGS. 1A to 1C has a structure in which the side edges of the pair of first protrusions 120a and 120b are on the inner side than the side edges of the gate electrode 104 in the direction of the channel length, and the side edges of the second protrusion 130 are also on the inner side than the side edges of the gate electrode 104 in the direction of the channel width. This is because the transistor 100 is formed using a multi-tone mask, and a manufacturing method for the transistor using a multi-tone mask is described later.

Figure 25C:
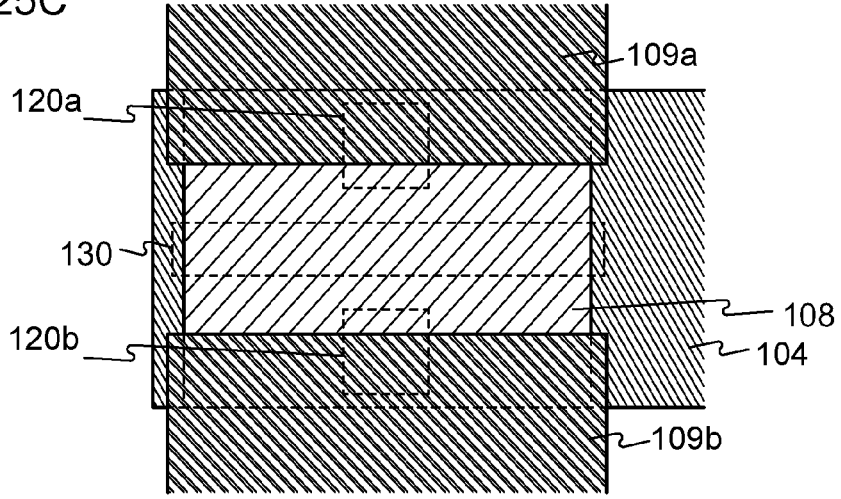

The side edges of the pair of electrodes 109a and 109b in the transistor 100 shown in FIG. 1A in the direction of the channel width is on the inner side than the side edges of semiconductor film 108. In the case where the side edges of the pair of electrodes 109a and 109b overlap with the pair of first protrusions 120a and 120b in the direction of the channel length, and the side edges of the pair of electrodes 109a and 109b are on the outer sides than the top surfaces of the pair of first protrusions 120a and 120b in the direction of the channel width, the side edges of the pair of electrodes 109a and 109b in the transistor 100 shown in FIG. 1A in the direction of the channel width may be on the outer sides than the semiconductor film 108 (see FIG. 25C).

The transistor 100 shown in FIGS. 1A to 1C has a top-contact structure in which the bottom surfaces of the pair of electrodes 109a and 109b are in contact with the top surface of the semiconductor film 108. However, a bottom-contact structure in which the top surfaces of the pair of electrodes 109a and 109b are in contact with the bottom surface of the semiconductor film 108 may be used.

Next, a manufacturing method for the transistor 100 is described. The cross-sectional views shown in FIGS. 2A and 2B, FIGS. 4A and 4B, FIGS. 6A and 6B, FIGS. 7A and 7B, and FIGS. 8A and 8B correspond to cross sectional views along dashed-dotted line A-B and dashed-dotted line C-D in FIG. 1A.

There is no particular limitation on a material and the like of the substrate 101 as long as the material has heat resistance high enough to withstand at least heat treatment performed later. For example, a glass substrate, a ceramic substrate, a quartz substrate, or a sapphire substrate may be used as the substrate 101. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 101. Still alternatively, any of these substrates further provided with a semiconductor element may be used as the substrate 101.

Further, a flexible substrate may be used as the substrate 101. In that case, a transistor is formed directly on the flexible substrate. Note that as a method for forming a transistor over a flexible substrate, there is also a method in which, after a non-flexible substrate is used as the substrate 101 and a transistor is formed thereover, the transistor is separated from the substrate and transferred to a flexible substrate. In that case, a separation layer is preferably provided between the substrate 101 and the transistor.

A conductive film 102 is formed over the substrate 101 by a sputtering method, a vacuum evaporation method, or a plating method with the use of any of the following conductive materials (see FIG. 2A). The thickness of the conductive film 102 is selected in consideration of the height H of each of the first protrusion 120a, the first protrusion 120b, and the second protrusion 130 and the effective channel length L of the transistor 100. For example, the thickness of the conductive film 102 may be greater than or equal to 100 nm.

The conductive film 102 can be formed with a single layer or a stacked layer using one or more of the following conductive materials: Al, Ti, Cr, Co, Ni, Cu, Y, Zr, Mo, Ag, Ta, and W, a nitride of any of these elements, an oxide of any of these elements, and an alloy of any of these elements. Further, in the case where the oxide is used as the gate electrode 104, the oxide may contain nitrogen at greater than or equal to $5\times10^{19}$ atoms/cm$^3$ and lower than or equal to 20 atomic %, preferably higher than or equal to $1\times10^{20}$ atoms/cm$^3$ and lower than or equal to 7 atomic %. For example, an oxide film which contains nitrogen at higher than or equal to $1\times10^{20}$ atoms/cm$^3$ and lower than or equal to 7 atomic % and also contains In, Ga, and Zn is preferably used.

Next, the conductive film 102 is processed, so that the gate electrode 104 which includes the pair of first protrusions 120a and 120b and the second protrusion 130 is formed. Note that the gate electrode 104 also serves as a gate line of the transistor 100.

The gate electrode 104 which includes the pair of first protrusions 120a and 120b and the second protrusion 130 can be formed using two photo masks each of which has different patterns by performing a photolithography step twice and an etching step twice. Instead of the photolithography steps, two kinds of masks each of which has different patterns may be formed by an inkjet method, a printing method, or the like. Note that in a manufacturing process of a transistor, the increase in number of masks causes an increase in number of the photolithography steps. This may lead to decrease in productivity such as low yield.

In this embodiment, a method by which the gate electrode 104 which includes the pair of first protrusions 120a and 120b and the second protrusion 130 is formed using a resist mask having regions with different thicknesses is described. The resist mask having regions with different thicknesses can be formed with the use of a multi-tone mask. A multi-tone mask is preferably used because the gate electrode 104 can be formed with the use of one photo mask and the pair of first protrusions 120a and 120b and the second protrusion 130 can be formed without increasing the number of the photolithography steps.

A multi-tone mask is a mask capable of light exposure with multi-level light intensity; typically, light exposure is performed with three levels of light intensity to provide an exposed region, a half-exposed region, and an unexposed region. With the use of a multi-tone mask, a resist mask having regions with different thicknesses (typically, two kinds of thicknesses) can be formed by one-time exposure and development process. Therefore, with the use of a multi-tone mask, the number of photomasks can be reduced.

Figures 1, 3A:
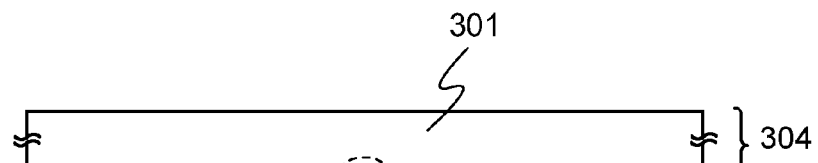
FIGS. 3A-1, 3A-2, 3B-1, and 3B-2 are cross-sectional views which illustrate a multi-tone mask.

A multi-tone mask is described with reference to FIGS. 3A-1, 3A-2, 3B-1, and 3B-2. FIGS. 3A-1 and 3B-1 are cross-sectional views of typical multi-tone masks. FIG. 3A-1 shows a gray-tone mask 304 and FIG. 3B-1 shows a half-tone mask 314.

The gray-tone mask 304 shown in FIG. 3A-1 includes, on a light-transmitting substrate 301, a light-blocking portion 302 formed using a light-blocking layer and a diffraction grating portion 303 formed by the pattern of the light-blocking layer.

The diffraction grating portion 303 has slits, dots, meshes, or the like provided at intervals which are less than or equal to the resolution limit of light used for the exposure, and thus control the light transmittance. Note that the slits, dots, or meshes provided at the diffraction grating portion 303 may be provided periodically or non-periodically.

Quartz or the like can be used as the light-transmitting substrate 301. The light-blocking layer included in the light-blocking portion 302 and the diffraction grating portion 303 may be formed using a metal film, and is preferably formed using chromium, chromium oxide, or the like.

Figures 2, 3A:
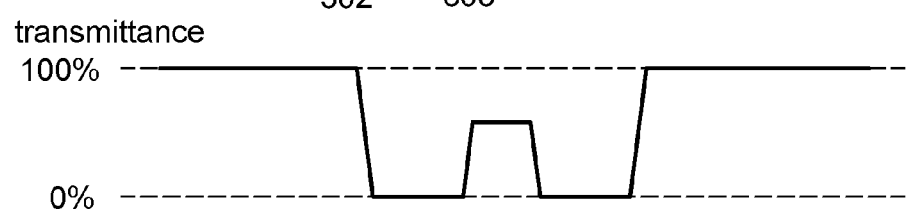
Figures 1, 3B:
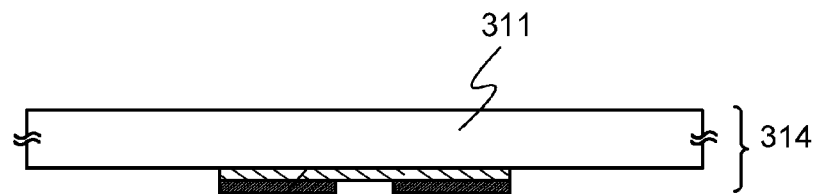
Figures 2, 3B:
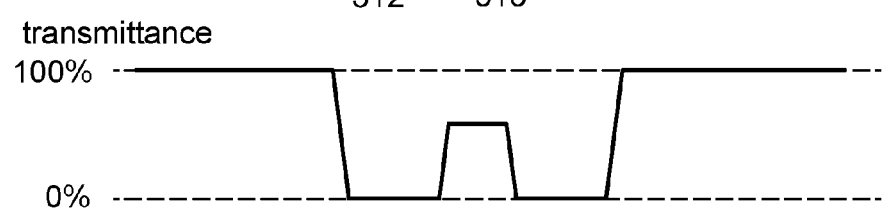

In the case where the gray-tone mask 304 is irradiated with light for light exposure, as shown in FIG. 3A-2, the light transmittance of the region overlapping with the light-blocking portion 302 is 0%, and the light transmittance of the region where neither the light-blocking portion 302 nor the diffraction grating portion 303 is provided is 100%. Further, the light transmittance of the diffraction grating portion 303 is approximately in the range of 10% to 70%, which can be adjusted by the interval of slits, dots, or meshes of the diffraction grating, or the like.

The half-tone mask 314 shown in FIG. 3B-1 includes, on a light-transmitting substrate 311, a semi-light-transmitting portion 312 and a light-blocking portion 313 which are formed using a semi-light-transmitting layer and a light-blocking layer, respectively.

The semi-light-transmitting portion 312 can be formed by using a layer of MoSiN, MoSi, MoSiO, MoSiON, CrSi, or the like. The light-blocking portion 313 may be formed using a metal film which is similar to that of the light-blocking layer of the gray-tone mask, and is preferably formed using chromium, chromium oxide, or the like.

In the case where the half-tone mask 314 is irradiated with light for light exposure, as shown in FIG. 3B-2, the light transmittance of the region overlapping with the light-blocking portion 313 is 0%, and the light transmittance of the region where neither the light-blocking portion 313 nor the semi-light-transmitting portion 312 is provided is 100%. Further, the light transmittance of the semi-light-transmitting portion 312 is approximately in the range of 10% to 70%, which can be adjusted by the kind of a material, thickness of a film, or the like.

Since a multi-tone mask can achieve three levels of exposure to obtain an exposed portion, a half-exposed portion, and an unexposed portion, a resist mask having regions with different thicknesses (typically, two kinds of thicknesses) can be formed by one-time exposure and development process. Thus, the number of photomasks used in the manufacturing process of the transistor 100 can be reduced with the use of the multi-tone mask.

A resist mask 150 having regions with different thicknesses is formed by a photolithography method with a half-tone mask over the conductive film 102.

A half-tone mask shown in FIG. 2B includes a semi-light-transmitting layer 141a and a light-blocking layer 141b over a light-transmitting substrate 140. The resist mask 150 is formed thick over a region in which the pair of first protrusions 120a and 120b and the second protrusion 130 are formed, and is formed thin over the other region (see FIG. 2B). Note that the resist mask 150 is not formed over a region of the conductive film 102 over which the gate electrode 104 is not formed. The thickness of the region of the resist mask 150 which is formed thin is determined in consideration of the distance between the first protrusion 120a and the second protrusion 130 and the distance between the first protrusion 120b and the second protrusion 130.

Next, part of the conductive film 102 is selectively removed (etched) with the use of the resist mask 150. A conductive film 103 which is processed into an island shape is formed by the etching. The etching may be performed by dry etching.

Figure 4A:
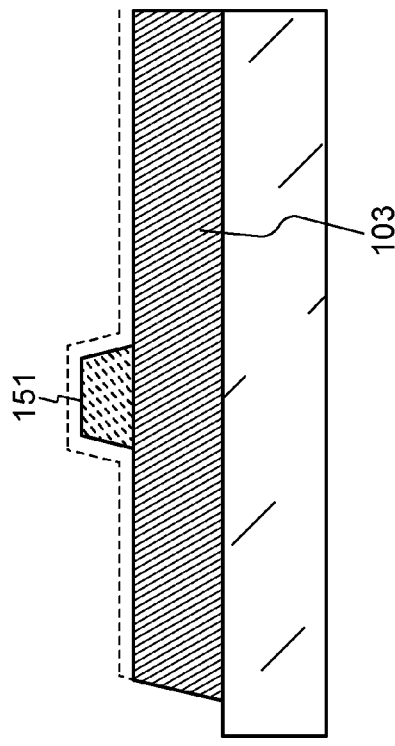
FIGS. 4A and 4B are cross-sectional views which show an example of a manufacturing method for a semiconductor device according to one embodiment of the present invention.
Figure 4B:
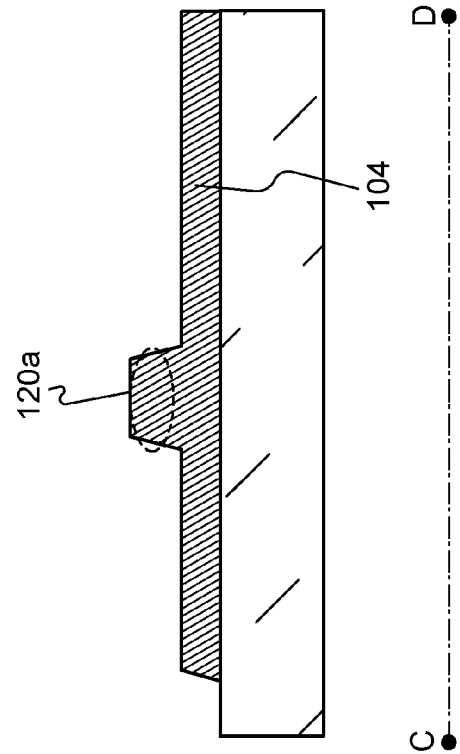

Next, the resist mask 150 is made to be reduced in size (to be receded) to form a resist mask 151 which is separated in a portion between the first protrusion 120a and the second protrusion 130 and a portion between the first protrusion 120b and the second protrusion 130 (see FIG. 4A). In order to reduce the size of (to recede) the resist mask 150, ashing by oxygen plasma may be employed.

Next, the conductive film 103 which is processed into an island shape is etched with the use of the resist mask 151, so that the pair of first protrusions 120a and 120b and the second protrusion 130 are formed, and the gate electrode 104 is formed. The resist mask 151 is removed after the etching (see FIG. 4B). The longer the etching period is, the higher the height H of each of the first protrusion 120a, the first protrusion 120b, and the second protrusion 130 is. At this time, the etching period is adjusted in consideration of etching rate of the conductive film 102 so that in the conductive film 103 which is processed into an island shape, a region in which the pair of first protrusions 120a and 120b and the second protrusion 130 are not formed is not lost.

The resist mask 151 which is formed by reducing the size of (receding) the resist mask 150 is used when the pair of first protrusions 120a and 120b and the second protrusion 130 are formed, so that the edge portions of the pair of first protrusions 120a and 120b and the second protrusion 130 in the direction of the channel length and the direction of the channel width are on the inner side than the edge portions of the gate electrode 104 in the direction of the channel length and the direction of the channel width, respectively, (see FIG. 1A).

Figure 5:
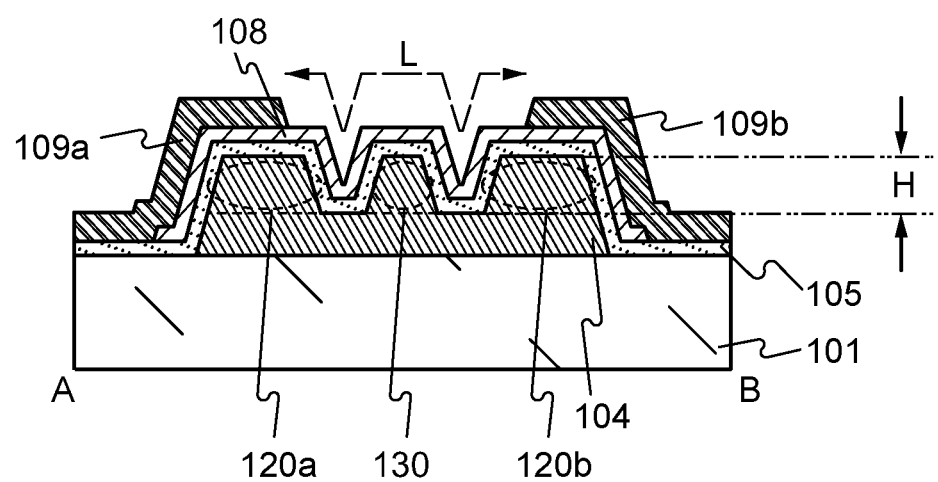
FIG. 5 is a cross-sectional view showing an example of a semiconductor device according to one embodiment of the present invention.

When the pair of first protrusions 120a and 120b and the second protrusion 130 are formed using two photomasks each of which has different patterns by performing a photolithography step twice and an etching step twice, the side edges of the pair of first protrusions 120a and 120b and the second protrusion 130 can be formed to be the side edges of the gate electrode 104. In this case, FIG. 25B is a top view of the transistor 100, and FIG. 5 is a cross-sectional view of the transistor 100 along dashed-dotted line A-B in FIG. 25B.

After the gate electrode 104 is formed, plasma treatment such as reverse sputtering treatment may be performed. With such treatment, the pair of first protrusions 120a and 120b and the second protrusion 130 are rounded to have a curved surface. Accordingly, the coverage of a film formed in the following manufacturing process of the transistor 100 can be improved.

Figure 6A:
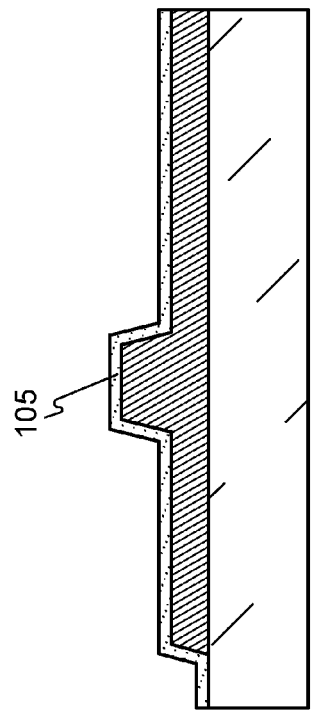
FIGS. 6A and 6B are cross-sectional views which show an example of a manufacturing method for a semiconductor device according to one embodiment of the present invention.

Next, the gate insulating film 105 is formed to cover the gate electrode 104 (see FIG. 6A). The thickness of the gate insulating film 105 may be greater than or equal to 1 nm and less than or equal to 300 nm.

The gate insulating film 105 may be formed with a stacked layer or a single layer using one or more of silicon oxide, silicon oxynitride, silicon nitride oxide, silicon nitride, aluminum oxide, hafnium oxide, yttrium oxide, zirconium oxide, and the like. For example, the gate insulating film 105 may be formed by a thermal oxidation method, a plasma CVD method, a sputtering method, or the like. In the case where the oxide semiconductor film is used as the semiconductor film 108 to be formed later, the gate insulating film 105 is preferably formed using a film from which oxygen is released by heat treatment. With the use of such a film from which oxygen is released by heat treatment, defects generated in the semiconductor film 108 to be formed later can be repaired and deterioration in electric characteristics of the transistor 100 can be suppressed.

To release oxygen by heat treatment means that the released amount of oxygen which is converted to oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

Here, a method in which the amount of released oxygen is measured by being converted into oxygen atoms using TDS analysis is described.

The amount of released gas in TDS analysis is proportional to the integral value of an ion intensity detected. Therefore, the amount of released gas can be calculated from the ratio between the integral value and the reference value of a standard sample. The reference value of a standard sample refers to the ratio of the density of a predetermined atom contained in a sample to the integral value of an ion intensity detected.

For example, the number of the released oxygen molecules ($N_{O2}$) from an insulating film can be found according to a numerical expression 1 with the TDS analysis results of a silicon wafer containing hydrogen at a predetermined density which is the standard sample and the TDS analysis results of the insulating film. Here, all ion intensity having a mass number of 32 which is obtained by the TDS analysis is assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal $$N_{O2}=N_{H2}/S_{H2} \times S_{O2} \times \alpha \qquad \text{(numerical expression 1)}$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Refer to Japanese Published Patent Application No. H6-275697 for details of the numerical expression 1. Note that the amount of released oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heat process may be an oxygen-excess silicon oxide ($SiO_X$ (X>2)) film. The oxygen-excess silicon oxide ($SiO_x$ (X>2)) film is a film of which the number of oxygen atoms per unit volume is more than twice the number of silicon atoms per unit volume. The number of silicon atoms and the number of oxygen atoms per unit volume are measured by Rutherford backscattering spectroscopy.

With the use of the insulating film from which oxygen is released by heating as the gate insulating film 105, oxygen is supplied to an oxide semiconductor film 107 to be described later, whereby the interface state between the gate insulating film 105 and the oxide semiconductor film 107 to be described later can be reduced. As a result, electric charge or the like generated due to operation of the transistor 100 can be prevented from being trapped at the interface state; therefore, the transistor 100 can be a transistor with less deterioration in electric characteristics.

Figure 6B:
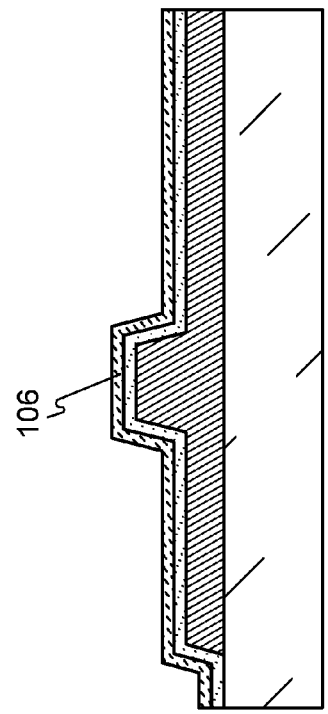

Next, an oxide semiconductor film 106 is formed over the gate insulating film 105 (see FIG. 6B).

The band gap of an oxide semiconductor film is larger than that of a silicon semiconductor film, and the oxide semiconductor film is used for the transistor 100 so that the off-state current can be reduced. Accordingly, the high on/off ratio of the transistor is easily obtained.

As the material of the oxide semiconductor film, two or more of metal oxide materials selected from In, Ga, Zn, and Sn may be used. For example, a four-structure metal oxide such as an In—Sn—Ga—Zn—O-based material; a three-structure metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-structure metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a single-structure metal oxide such as an In—O-based material, a Sn—O-based material, a Zn—O-based material; or the like may be used. Here, for example, an In—Ga—Zn—O-based material means oxide containing indium (In), gallium (Ga), and zinc (Zn), and there is no particular limitation on the composition ratio. Further, the In—Ga—Zn—O-based oxide semiconductor may contain an element other than In, Ga, and Zn. At this time, the amount of oxygen is preferably in excess of stoichiometry in the oxide semiconductor film. When the amount of oxygen is in excess of stoichiometry, generation of carriers which results from oxygen deficiency in the oxide semiconductor film can be suppressed.

For example, in the case where an In—Zn—O-based material is used as the oxide semiconductor film, the atomic ratio thereof is In/Zn=0.5 to 50 inclusive, preferably In/Zn=1 to 20 inclusive, more preferably In/Zn=3 to 30 inclusive. When the atomic ratio of In to Zn is in the above range, the field-effect mobility of the transistor 100 can be improved. Here, when the atomic ratio of the compound is In:Zn:O=X:Y:Z, the relation of Z>1.5X+Y is preferably satisfied.

Further, a material represented by $InMO_3(ZnO)_m$ (m>0) may be used as the oxide semiconductor film. Here, M represents one or more metal elements selected from Ga, Al, Mn, and Co. For example, M may be Ga, Ga and Al, Ga and Mn, Ga and Co, or the like.

An oxide semiconductor film is in a single crystal state, a polycrystalline (also referred to as polycrystal) state, an amorphous state, or the like. An oxide semiconductor film is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°. Nitrogen may be substituted for part of oxygen included in CAAC-OS.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The oxide semiconductor film 106 formed over the gate insulating film 105 is formed by a sputtering method, a molecular beam epitaxy method, an atomic layer deposition, or a pulsed laser deposition method. Here, the oxide semiconductor film 106 is formed by a sputtering method. The thickness of the oxide semiconductor film 106 may be greater than or equal to 1 nm and less than or equal to 50 nm.

When the oxide semiconductor film 106 is a CAAC-OS film, the oxide semiconductor film 106 may be formed while the substrate 101 is heated. The temperature of heating the substrate 101 is preferably higher than or equal to 150° C. and lower than or equal to 450° C., and the substrate temperature is preferably higher than or equal to 200° C. and lower than or equal to 350° C. Note that the CAAC-OS film whose proportion of crystal portions to an amorphous portion is high can be formed by heating the substrate at high temperature in formation of the oxide semiconductor film.

It is preferable that the hydrogen concentration of the oxide semiconductor film 106 be sufficiently reduced when the oxide semiconductor film 106 is formed by a sputtering method. In order to reduce the hydrogen concentration, a high-purity rare gas (typically, argon) from which impurities such as hydrogen, water, a hydroxyl group, and hydride are removed, oxygen, or a mixed gas of a rare gas and oxygen is used as the atmosphere gas. Evacuation of the treatment chamber is preferably performed with a cryopump having a high capability in evacuating water or a sputtering ion pump having a high capability in evacuating hydrogen in combination.

In the manner described above, the oxide semiconductor film 106 into which entry of hydrogen is suppressed can be formed. Note that even when the sputtering apparatus is used, the oxide semiconductor film 106 contains more than a little nitrogen. For example, the nitrogen concentration of the oxide semiconductor film 106 measured by secondary ion mass spectroscopy (SIMS) is lower than $5\times10^{18}$ atoms/cm$^3$.

The gate insulating film 105 and the oxide semiconductor film 106 may be successively formed in vacuum. For example, the following steps may be performed: impurities including hydrogen attached to a surface of the gate electrode 104 over the substrate 101 are removed by heat treatment or plasma treatment, and then the gate insulating film 105 and the oxide semiconductor film 106 are successively formed in this order without exposure to the atmosphere. In this manner, impurities including hydrogen attached to a surface of the gate electrode 104 are reduced, and atmospheric structure attached to an interface between the gate insulating film 105 and the oxide semiconductor film 106 can be reduced. As a result, it is possible to manufacture the transistor 100 having favorable electric characteristics and high reliability.

Next, a resist mask is formed over the oxide semiconductor film 106 by a photolithography step, and the oxide semiconductor film 106 is etched into a desired shape with the use of the resist mask; then, the oxide semiconductor film 107 having an island shape is formed (see FIG. 7A). The etching may be performed by dry etching or wet etching.

Further, in some cases, electric charge is generated due to oxygen deficiency in the oxide semiconductor film 107. The electric charge is generated when the oxide semiconductor film 106 or the oxide semiconductor film 107 is formed. In general, when oxygen deficiency is caused in an oxide semiconductor, part of the oxygen deficiency becomes a donor to generate an electron as a carrier. That is, the generation of an electron causes negative shift in the threshold voltage of the transistor 100. In addition, the generation of an electron in the oxide semiconductor film 107 often occurs in oxygen deficiency caused in the vicinity of the interface between the oxide semiconductor film 106 and the gate insulating film 105 (or the interface between the oxide semiconductor film 107 and the gate insulating film 105).

Therefore, first heat treatment is performed on the oxide semiconductor film 107 to form an oxide semiconductor film 111 (see FIG. 7B). Note that the oxide semiconductor film 111 corresponds to the semiconductor film 108 in the transistor 100 shown in FIGS. 1A to 1C. Further, the semiconductor film 108 may be formed using another material having semiconductor characteristics instead of the oxide semiconductor film 111. For example, the semiconductor film 108 may be formed using a silicon semiconductor film having crystallinity as typified by a single crystal silicon film or a polycrystalline silicon film.

By the first heat treatment, hydrogen (including water, a hydroxyl group, and hydride) is released from the oxide semiconductor film 107, part of oxygen contained in the gate insulating film 105 is released, and oxygen is diffused into the oxide semiconductor film 107 and the vicinity of an interface between the gate insulating film 105 and the oxide semiconductor film 107. Further, the interface states between the gate insulating film 105 and the oxide semiconductor film 107 and oxygen deficiency of the oxide semiconductor film 107 are reduced, and the influence of carrier trapping at the interface between the oxide semiconductor film 111 and the gate insulating film 105 in the transistor 100 can be reduced. Thus, the first heat treatment can prevent the threshold voltage from shifting in the negative direction.

The first heat treatment is performed at a temperature at which the above phenomena can occur, specifically, higher than or equal to 150° C. and lower than the strain point of the substrate, preferably higher than or equal to 250° C. and lower than or equal to 450° C., further preferably higher than or equal to 300° C. and lower than or equal to 450° C., in an oxidation atmosphere or an inert atmosphere. Here, the oxidation atmosphere refers to an atmosphere including an oxidation gas such as oxygen, ozone, or nitrogen oxide at higher than or equal to 10 ppm. The inert atmosphere refers to an atmosphere which includes the oxidation gas at lower than 10 ppm and is filled with nitrogen or a rare gas. The treatment time is 3 minutes to 24 hours. Heat treatment for longer than 24 hours is not preferable because the productivity is decreased.

There is no particular limitation on a heat treatment apparatus used for the first heat treatment, and the apparatus may be including a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

Further, hydrogen in the first oxide semiconductor film 107 serves as a donor to generate an electron which is a carrier. By the first heat treatment, the hydrogen concentration of the oxide semiconductor film 107 is reduced, whereby the highly purified oxide semiconductor film 111 is formed. The hydrogen concentration of the oxide semiconductor film 111 is less than or equal to $5 \times 10^{18}$ atoms/cm$^3$, preferably less than or equal to $1 \times 10^{18}$ atoms/cm$^3$, further preferably less than or equal to $5 \times 10^{17}$ atoms/cm$^3$, still further preferably less than or equal to $1 \times 10^{16}$ atoms/cm$^3$. Note that the hydrogen concentration of the oxide semiconductor film 111 is measured by secondary ion mass spectroscopy (SIMS).

The hydrogen concentration of the oxide semiconductor film 111 is sufficiently reduced and the oxide semiconductor film 111 is highly purified, and the defect level in the energy gap, which is generated due to oxygen deficiency, is reduced because oxygen is sufficiently supplied to the oxide semiconductor film 111 by the first heat treatment; thus, the off-state current of the transistor 100 with the oxide semiconductor film 111 can be reduced. Specifically, the off-state current (value of a transistor with the channel length of 3 μm and the channel width of 1 μm) at room temperature (25° C.) is lower than or equal to 100 zA (1 zA (zeptoampere) is $1 \times 10^{-21}$ A), preferably lower than or equal to 10 zA. Since an alkali metal such as Li or Na is an impurity, the amount of the alkali metal which enters the oxide semiconductor film 111 is preferably reduced. The concentration of the alkali metal in the oxide semiconductor film 111 is lower than or equal to $2 \times 10^{16}$ atoms/cm$^3$, preferably lower than or equal to $1 \times 10^{15}$ atoms/cm$^3$. Further, the amount of alkaline earth metal is preferably reduced since it is also an impurity.

In the manufacturing process of the transistor 100, the timing of the first heat treatment is not limited to the timing after the oxide semiconductor film 107 is formed. The first heat treatment may be performed any time after the oxide semiconductor film 106 is formed. The heat treatment may be performed plural times. For example, the heat treatment may be performed not only once after formation of the oxide semiconductor film 107 but also twice after formation of the oxide semiconductor film 106 and after formation of the oxide semiconductor film 107.

First, a conductive film is formed over the gate insulating film 105 and the oxide semiconductor film 111. The conductive film is formed with a single layer or a stacked layer using a conductive material which is applicable to the conductive film 102 used for forming the gate electrode 104. The thickness of the conductive film is not particularly limited and can be determined as appropriate depending on the electric resistance of the above conductive material and a period of time for the manufacturing step. For example, the thickness of the conductive film may be greater than or equal to 10 nm and less than or equal to 500 nm. The method for manufacturing the conductive film is similar to that of the conductive film 102.

Next, a resist mask is formed over the conductive film by a photolithography step, and the conductive film is etched with the use of the resist mask; then, the pair of electrodes 109*a* and 109*b* is formed (see FIG. 8A). The etching may be performed by dry etching or wet etching. Note that the pair of electrodes 109*a* and 109*b* function as a source electrode and a drain electrode, and also function as a source line and a drain line.

With the above steps, the transistor 100 is formed. Note that after the manufacturing process up to here, a protective insulating film 110 may be formed (see FIG. 8B). The protective insulating film 110 may be formed in a similar manner to that of the gate insulating film 105. Further, second heat treatment may be performed after the protective insulating film 110 is formed. Part of oxygen in the gate insulating film 105 and part of oxygen in the protective insulating film 110 can be diffused in the oxide semiconductor film 111, in the vicinity of the interface between the gate insulating film 105 and the oxide semiconductor film 111, and in the vicinity of the interface between the oxide semiconductor film 111 and the protective insulating film 110 by performing the second heat treatment. Accordingly, the oxygen deficiency in the oxide semiconductor film 111 can be compensated, and the electric characteristics of the transistor 100 can be improved. The apparatus and the heat condition of the second heat treatment may be similar to those of the first heat treatment.

Since the gate electrode 104 in the transistor 100 includes the pair of first protrusions 120*a* and 120*b* and the second protrusion 130, the effective channel length can be three times or more, further preferably five times or more, still further preferably 10 times or more the apparent channel length, which is the distance between the pair of electrodes 109*a* and 109*b* in the top view. The effective channel width can be three times or more, further preferably five times or more, still further preferably 10 times or more the apparent channel width, which is the distance between the width between the pair of electrodes 109*a* and 109*b* in the top view. Accordingly, even in the case where the transistor is reduced in size, the influence caused by the short-channel effect can be suppressed and the integration degree of the semiconductor device can be improved. Further, the semiconductor device at low manufacturing cost with high yield can be provided.

Note that the structure described in this embodiment can be combined with any of the structures described in other embodiments as appropriate.

[Embodiment 2]

In this embodiment, a transistor having a structure different from that of the transistor 100 described in Embodiment 1 is described.

One embodiment of the present invention is a bottom-gate transistor including the gate electrode which includes a plurality of second protrusions. In this embodiment, the structure in which the gate electrode 104 includes a plurality of pair of first protrusions 120*a* and 120*b* is described. A transistor in this embodiment is different from the transistor in Embodiment 1 only in the number of the pair of first protrusions 120*a* and 120*b*; therefore, Embodiment 1 can be referred to as appropriate.

A transistor 200 including the gate electrode 104 includes three pairs of first protrusions 120*a* and 120*b* is described as an example in this embodiment.

Figure 9A:
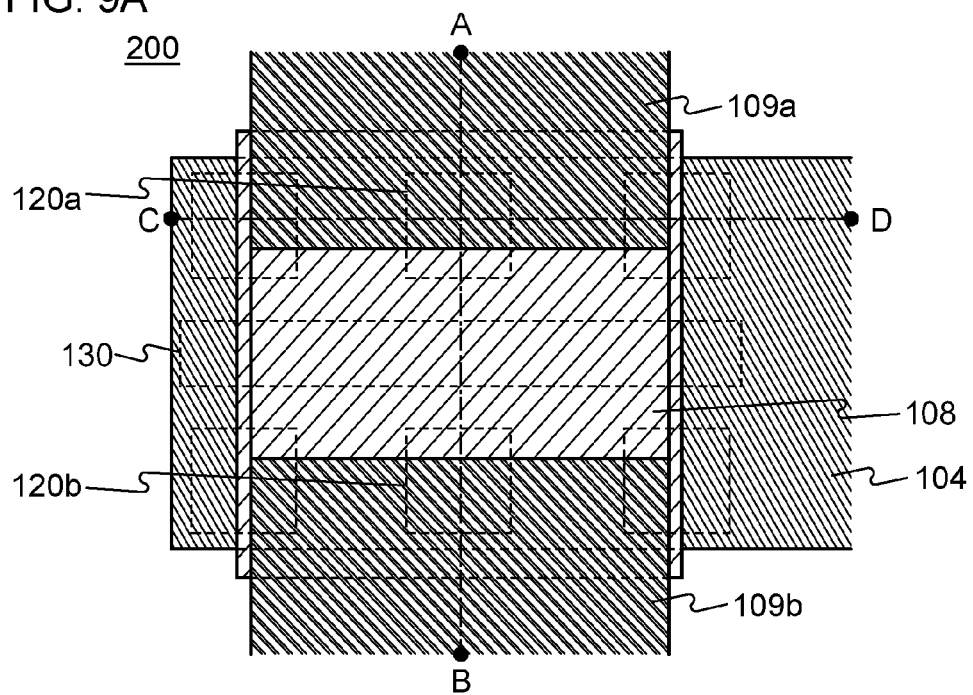
FIGS. 9A to 9C are a top view and cross-sectional views, respectively, which show an example of a semiconductor device according to one embodiment of the present invention.

FIG. 9A is a top view of the transistor 200.

The transistor 200 having a bottom gate structure includes the gate electrode 104 which includes, over the substrate 101, the three pairs of first protrusions 120*a* and 120*b* and the second protrusion 130 provided between the three pairs of first protrusions 120*a* and 120*b*; the gate insulating film 105 covering the gate electrode 104; the semiconductor film 108 which is in contact with the gate insulating film 105 and overlaps with the three pairs of first protrusions 120*a* and 120*b* and the second protrusion 130; and the pair of electrodes 109*a* and 109*b* which is in contact with the semiconductor film 108 and overlaps with the three pairs of first protrusions 120*a* and 120*b*. Note that the gate insulating film 105 is not shown in FIG. 9A for convenience.

In the direction of the channel width, the side edges of the semiconductor film 108 are provided over the top surfaces of the pair of first protrusions 120*a* and 120*b* which are placed on the outermost side of the three pairs of first protrusions 120*a* and 120*b* of the gate electrode 104.

Further, in the direction of the channel width, the side edges of the pair of electrodes 109*a* and 109*b* are provided over the top surfaces of the pair of first protrusions 120*a* and 120*b* which are placed on the outermost side of the three pairs of first protrusions 120*a* and 120*b* of the gate electrode 104.

Figure 9B:
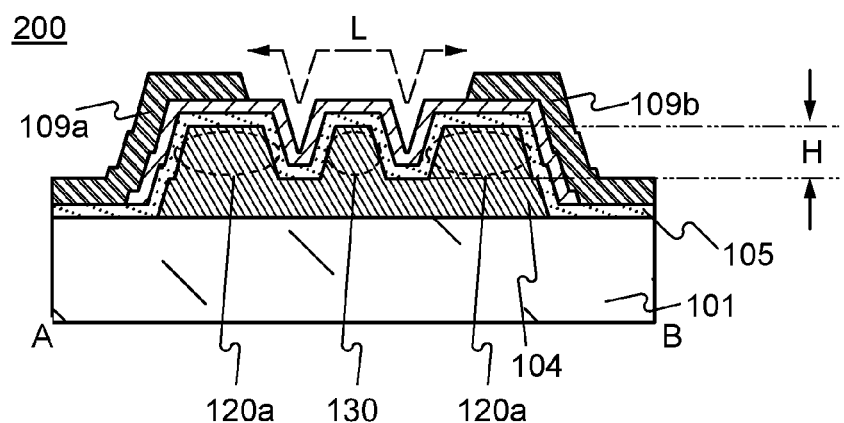

Each of the three pairs of first protrusions 120*a* and 120*b* of the gate electrode 104 faces each other with the second protrusion 130 extending in the direction of the channel width provided therebetween. FIG. 9B is a cross-sectional view of the transistor 200 along dashed-dotted line A-B in FIG. 9A. As shown in FIG. 9B, the cross section A-B of the transistor 200 is similar to that of the transistor 100.

The semiconductor film 108 in the transistor 200 is formed along the shape of the three pairs of first protrusions 120*a* and 120*b* and the second protrusion 130 of the gate electrode 104. Accordingly, a three-dimensional channel region is formed in the transistor 200. Further, an effective channel length L which functions in operation of the transistor 200 is longer than an apparent channel length which corresponds to the distance between the pair of electrodes 109*a* and 109*b* in FIG. 9A by at least the height H of each of the first protrusions 120*a*, the first protrusions 120*b*, and the second protrusion 130 (see FIG. 9B).

Figure 9C:
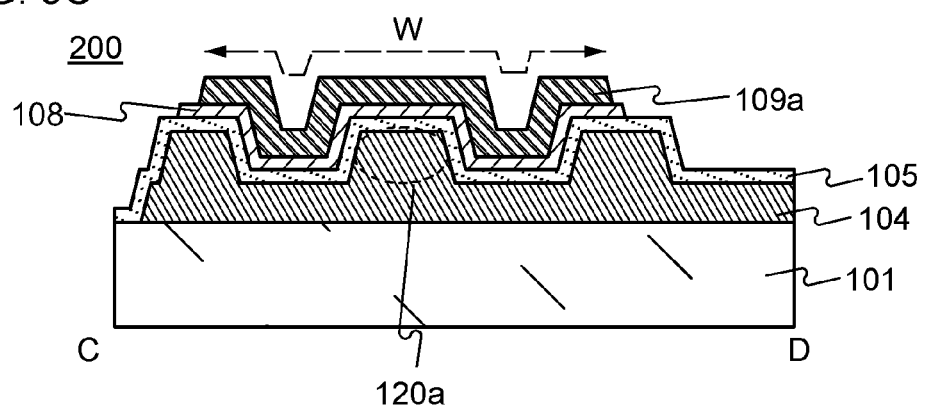

FIG. 9C is a cross-sectional view of the transistor 200 along dashed-dotted line C-D in FIG. 9A.

As shown in FIG. 9C, the transistor 200 in the cross section C-D includes the substrate 101; the gate electrode 104 which includes the three first protrusions 120*a* which are each one of the three pairs of first protrusions 120*a* and 120*b* and each separately placed; the gate insulating film 105 covering the gate electrode 104; the semiconductor film 108 which is in contact with the gate insulating film 105 and overlaps with the gate electrode 104 and all of the three pairs of first protrusions 120*a* and 120*b*; and the electrode 109*a* which is one of the pair of electrodes 109*a* and 109*b* and is in contact with the semiconductor film 108 and overlaps with all of the three pairs of first protrusions 120*a* and 120*b*.

The semiconductor film 108 in the transistor 200 is formed along the shape of the three pairs of first protrusions 120*a* and 120*b* of the gate electrode 104. Accordingly, a three-dimensional channel region is formed in the transistor 200. Further, an effective channel width W which functions in operation of the transistor 200 is longer than an apparent channel width which corresponds to the width between the pair of electrodes 109*a* and 109*b* in FIG. 9A by at least the height H of each of the first protrusions 120*a* and the first protrusions 120*b* of which the transistor is formed along the shapes (see FIG. 9C).

As described in Embodiment 1, the height H of each of the first protrusions 120*a*, the first protrusions 120*b*, and the second protrusion 130 is selected so that the effective channel width W and the effective channel length L of the three pairs of first protrusions 120*a* and 120*b* and the second protrusion 130 are three times or more, further preferably five times or more, still further preferably 10 times or more the apparent channel width and the apparent channel length, respectively. Note that the height H of each of the first protrusions 120*a* and the first protrusions 120*b* is the same as the height H of the second protrusion 130 because the three pairs of first protrusions 120*a* and 120*b* and the second protrusion 130 are formed in the same manufacturing process.

The number of the pair of first protrusions of the gate electrode 104 is not particularly limited, and it may be determined depending on the size of a transistor to be manufactured as appropriate. The gate electrode may include not only a plurality of pairs of first protrusions but also a plurality of second protrusions may be provided for the gate electrode. The plurality of pairs of first protrusions and the plurality of second protrusions are formed, so that the height of each pair of (each of) the first protrusions and the second protrusions can be lowered; therefore, the coverage of a film formed in the manufacturing process of the transistor can be improved.

That is, the transistor 200 is reduced in size, the effective channel length L is lengthened, and the short-channel effect can be suppressed. Further, the effective channel width W of the transistor 200 is lengthened and the on-state current thereof can be increased. Accordingly, the transistor 200 has excellent switching characteristics with sufficiently high on/off ratio.

Here, a manufacturing method for the transistor 200 is described.

Figure 10A:
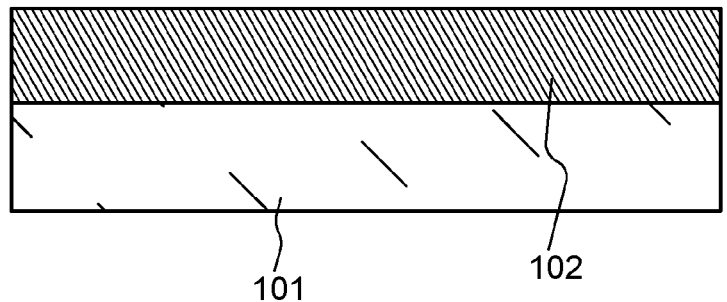
FIGS. 10A to 10D are cross-sectional views which show an example of a manufacturing method for a semiconductor device according to one embodiment of the present invention.

The conductive film 102 is formed over the substrate 101 in a similar manner to Embodiment 1 (see FIG. 10A).

Figure 10B:
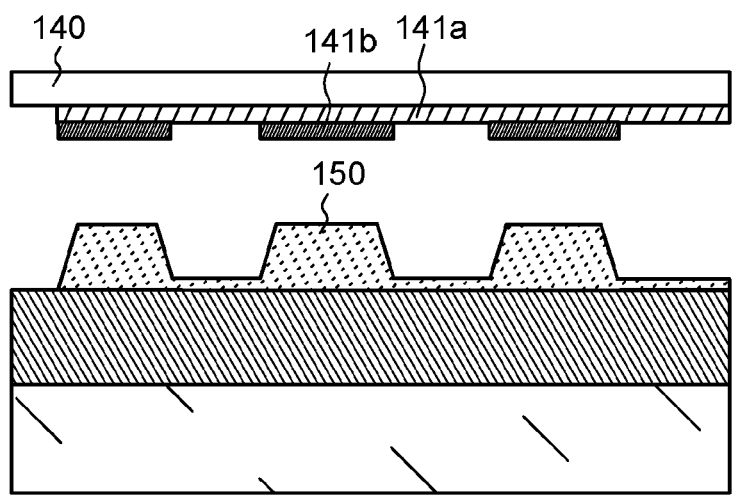
Figure 10C:
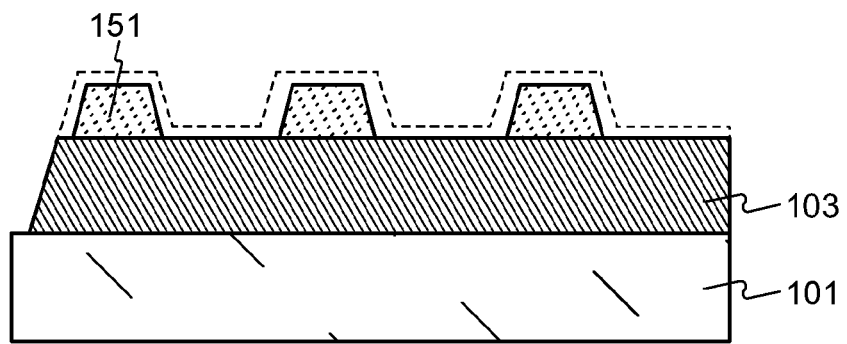

Next, the resist mask 150 is formed thick over a region in which the three pairs of first protrusions 120*a* and 120*b* and the second protrusion 130 are to be formed, and is formed thin over the other region with the use of a half-tone mask (see FIG. 10B). Note that the resist mask 150 is not formed over a region of the conductive film 102 over which the gate electrode 104 is not formed. The thickness of a region of the resist mask 150 which is formed thin is determined in consideration of the distance between each of the first protrusions 120*a* and the second protrusion 130 and the distance between each of the first protrusions 120*b* and the second protrusion 130.

In the case where the number of the pair of first protrusions 120*a* and 120*b* of the gate electrode 104 is further increased, in a resist mask are formed to have regions with different thicknesses with the use of a multi-tone mask, a region with a large thickness is formed equivalently to the number of the pair of first protrusions 120*a* and 120*b*, and a region with a small thickness is formed in the other region.

Next, part of the conductive film 102 is selectively removed (etched) with the use of the resist mask 150. The conductive film 103 which is processed into an island shape is formed by the etching. The etching may be performed by dry etching.

Next, the resist mask 150 is made to be reduced in size (to be receded) to form a resist mask 151 which is separated in a portion between each of the first protrusions 120*a* and the second protrusion 130 and a portion between each of the first protrusions 120*b* and the second protrusion 130 (see FIG.

10C). In order to reduce the size of (to recede) the resist mask 150, ashing by oxygen plasma may be employed.

Figure 10D:
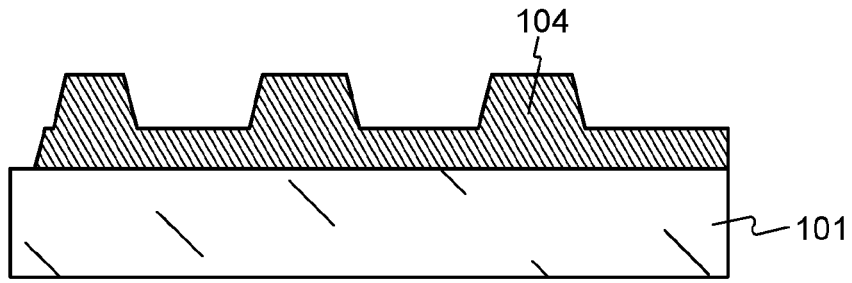

Next, the conductive film 103 which is processed into an island shape is etched with the use of the resist mask 151, so that the three pairs of first protrusions 120a and 120b and the second protrusion 130 are formed, and the gate electrode 104 is formed. The resist mask 151 is removed after the etching (see FIG. 10D).

The following manufacturing process of the transistor 200 is similar to that for manufacturing the transistor 100 (see FIGS. 6A and 6B, FIGS. 7A and 7B, and FIGS. 8A and 8B).

The transistor 200 described in this embodiment includes the plurality of pairs of first protrusions 120a and 120b and the second protrusion 130 of the gate electrode 104, so that the effective channel length L can be three times or more, further preferably five times or more, still further preferably 10 times or more the apparent channel length. Further, the effective channel width W can be three times or more, further preferably five times or more, still further preferably 10 times or more the apparent channel width. Accordingly, even in the case where the transistor is reduced in size, the short-channel effect can be suppressed and the integration degree of the semiconductor device can be improved. Further, the semiconductor device at low manufacturing cost with high yield can be provided.

Note that the structure described in this embodiment can be combined with any of the structures described in other embodiments as appropriate.

[Embodiment 3]

In this embodiment, a transistor having a structure different from that of the transistor described in the above embodiment is described.

One embodiment of the present invention is a bottom-gate transistor including the gate electrode which includes a plurality of second protrusions. In this embodiment, the structure in which the gate electrode 104 includes a plurality of second protrusions 130 is described. A transistor in this embodiment is different from the transistor in Embodiment 1 only in the number of the second protrusions 130; therefore, Embodiment 1 can be referred to as appropriate.

A transistor 300 including the gate electrode 104 which includes two second protrusions 130 is described as an example in this embodiment.

Figure 11A:
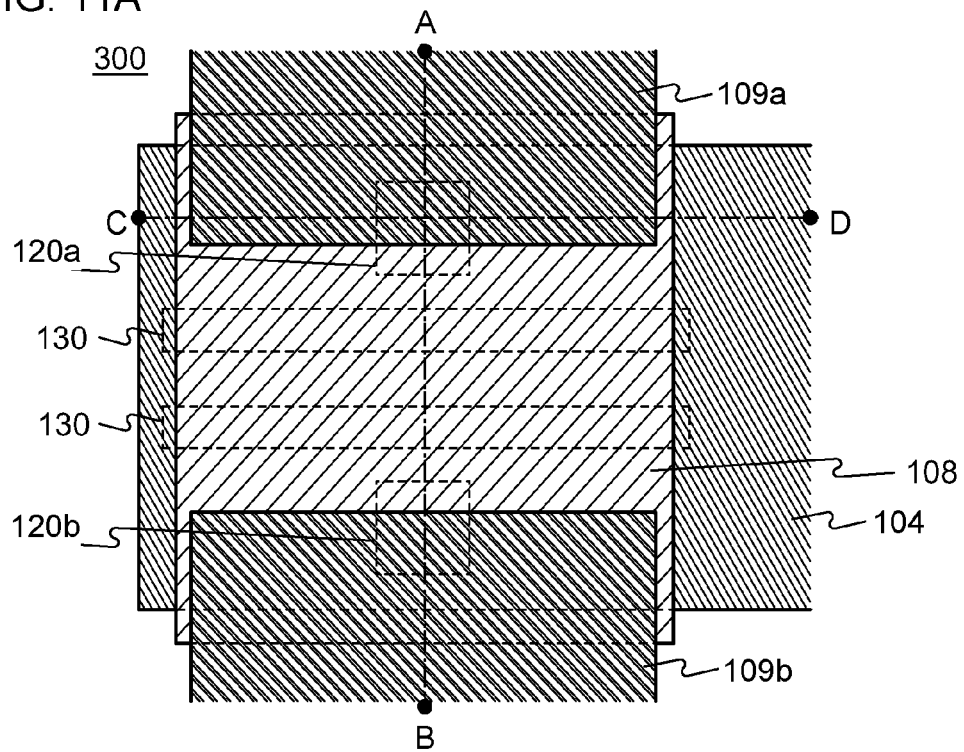
FIGS. 11A to 11C are a top view and cross-sectional views, respectively, which show an example of a semiconductor device according to one embodiment of the present invention.

FIG. 11A is a top view of the transistor 300.

The transistor 300 having a bottom gate structure includes the gate electrode 104 which includes, over the substrate 101, a pair of first protrusions 120a and 120b and the two second protrusions 130 provided between the pair of first protrusions 120a and 120b; the gate insulating film 105 covering the gate electrode 104; the semiconductor film 108 which is in contact with the gate insulating film 105 and overlaps with the pair of first protrusions 120a and 120b and the two second protrusions 130; and the pair of electrodes 109a and 109b which is in contact with the semiconductor film 108 and overlaps with the two pairs of first protrusions 120a and 120b. Note that the gate insulating film 105 is not shown in FIG. 11A for convenience.

In the direction of the channel width, the side edges of the semiconductor film 108 are on the outer sides than the top surfaces of the pair of first protrusions 120a and 120b of the gate electrode 104.

Further, in the direction of the channel width, the side edges of the pair of electrodes 109a and 109b are on the outer sides than the top surfaces of the pair of first protrusions 120a and 120b of the gate electrode 104.

The pair of first protrusions 120a and 120b of the gate electrode 104 faces each other with the two second protrusions 130 extending in the direction of the channel width provided therebetween.

Figure 11B:
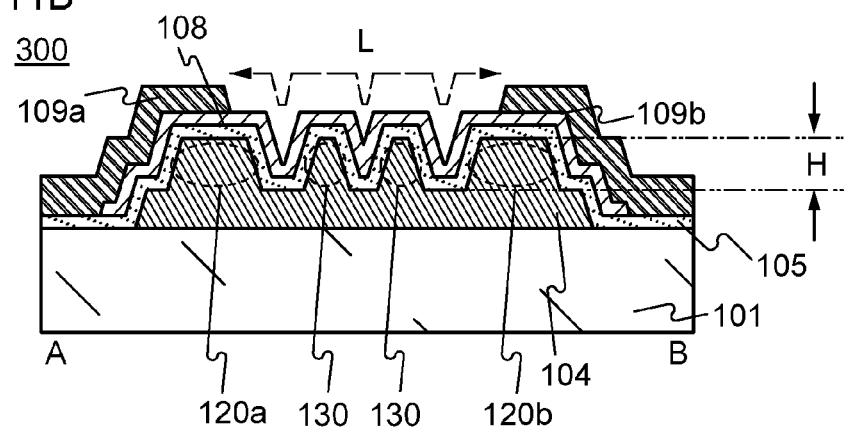

FIG. 11B is a cross-sectional view of the transistor 300 along dashed-dotted line A-B in FIG. 11A.

The transistor 300 in the cross section A-B shown in FIG. 11B is a bottom-gate transistor including the substrate 101; the gate electrode 104 which includes the pair of first protrusions 120a and 120b and the two second protrusions 130 provided between the pair of first protrusions 120a and 120b; the gate insulating film 105 covering the gate electrode 104; the semiconductor film 108 which is in contact with the gate insulating film 105 and overlaps with the pair of first protrusions 120a and 120b and the two second protrusions 130; and the pair of electrodes 109a and 109b which is in contact with the semiconductor film 108 and overlaps with the pair of first protrusions 120a and 120b.

The semiconductor film 108 in the transistor 300 is formed along the shape of the pair of first protrusions 120a and 120b and the two second protrusions 130 of the gate electrode 104. Accordingly, a three-dimensional channel region is formed in the transistor 300. Further, an effective channel length L which functions in operation of the transistor 300 is longer than an apparent channel length which corresponds to the distance between the pair of electrodes 109a and 109b in FIG. 11A by at least the height H of each of the first protrusion 120a, the first protrusion 120b, and the two second protrusions 130 (see FIG. 11B).

Figure 11C:
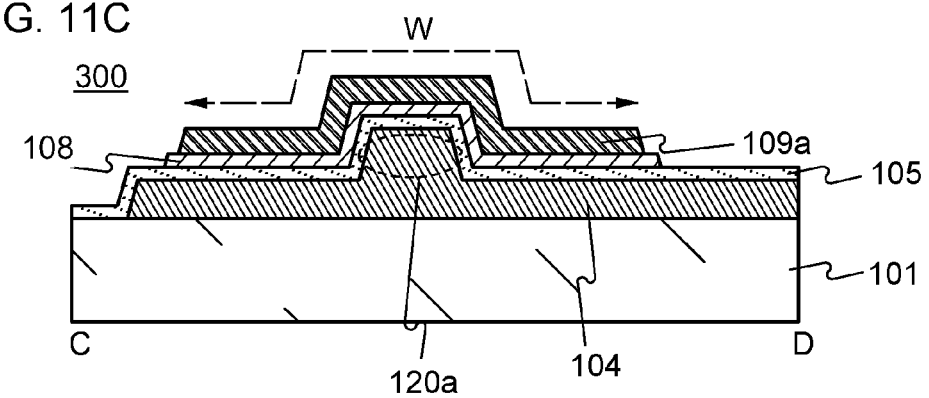

FIG. 11C is a cross-sectional view of the transistor 300 along dashed-dotted line C-D in FIG. 11A. Note that the cross section C-D of the transistor 300 is similar to that of the transistor 100 as shown in FIG. 11C.

The semiconductor film 108 in the transistor 300 is formed along the shape of the pair of first protrusions 120a and 120b of the gate electrode 104. Accordingly, a three-dimensional channel region is formed in the transistor 300. Further, an effective channel width W which functions in operation of the transistor 300 is longer than an apparent channel width which corresponds to the width between the pair of electrodes 109a and 109b in FIG. 11A by at least the height H of each of the first protrusion 120a and the first protrusion 120b (see FIG. 11C).

As described in Embodiment 1, the height H of each of the first protrusion 120a, the first protrusion 120b, and the two second protrusions 130 is selected so that the effective channel width W and the effective channel length L of the pair of first protrusions 120a and 120b and the two second protrusions 130 are three times or more, further preferably five times or more, still further preferably 10 times or more the apparent channel width and the apparent channel length, respectively. Note that the height H of each of the first protrusion 120a and the first protrusion 120b is the same as the height H of each of the two second protrusions 130 because the pair of first protrusions 120a and 120b and the two second protrusions 130 are formed in the same manufacturing process.

The number of the pair of second protrusions of the gate electrode is not particularly limited, and it may be determined depending on the size of a transistor to be manufactured as appropriate. As described in Embodiment 2, the gate electrode may include not only a plurality of second protrusions but also a plurality of pairs of first protrusions. The plurality of pairs of first protrusions and the plurality of second protrusions are formed, so that the height of each pair of (each of) the first protrusions and the second protrusions can be lowered; therefore, the coverage of a film formed in the manufacturing process of the transistor can be improved.

That is, the transistor 300 is reduced in size, the effective channel length L is lengthened, and the short-channel effect can be reduced. Further, the effective channel width W of the transistor 300 is lengthened and the on-state current thereof can be increased. Accordingly, the transistor 300 has excellent switching characteristics with sufficiently high on/off ratio.

Here, a manufacturing method for the transistor 300 is described. Since the cross section C-D of the transistor 300 is similar to that of the transistor 100, the cross section A-B of the transistor 300 is described as an example.

Figure 12A:
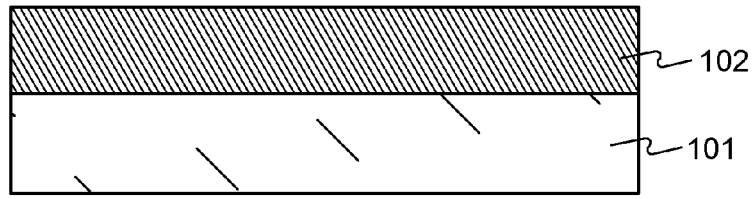
FIGS. 12A to 12D are cross-sectional views which show an example of a manufacturing method for a semiconductor device according to one embodiment of the present invention.

The conductive film 102 is formed over the substrate 101 in a similar manner to Embodiment 1 (see FIG. 12A).

Figure 12B:
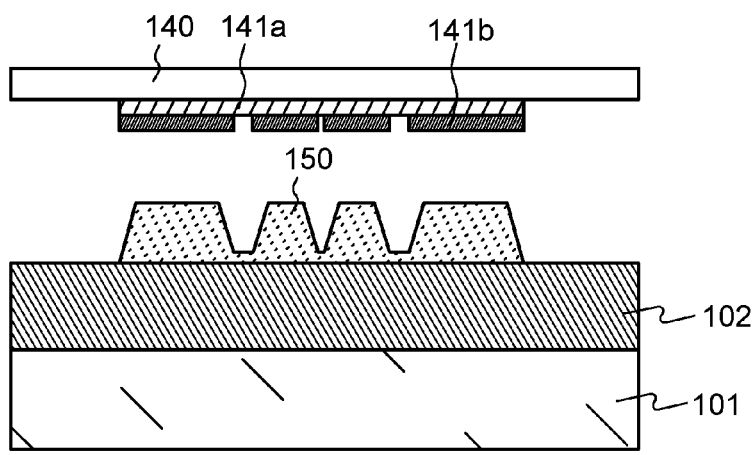

Next, the resist mask 150 is formed thick over a region in which the pair of first protrusions 120a and 120b and the two second protrusions 130 are to be formed, and is formed thin over the other region with the use of a half-tone mask (see FIG. 12B). Note that the resist mask 150 is not formed over a region of the conductive film 102 over which the gate electrode 104 is not formed. The thickness of a region of the resist mask 150 which is formed thin is determined in consideration of the distance between the first protrusion 120a and one of the two second protrusions 130, the distance between the two second protrusions 130, and the distance between the first protrusion 120b and the other of the two second protrusions 130.

In the case where the number of the second protrusions 130 of the gate electrode 104 is further increased, in a resist mask are formed to have regions with different thicknesses with the use of a multi-tone mask, a region with a large thickness is formed equivalently to the number of the second protrusions 130, and a region with a small thickness is formed in the other region.

Next, part of the conductive film 102 is selectively removed (etched) with the use of the resist mask 150. The conductive film 103 which is processed into an island shape is formed by the etching. The etching may be performed by dry etching.

Figure 12C:
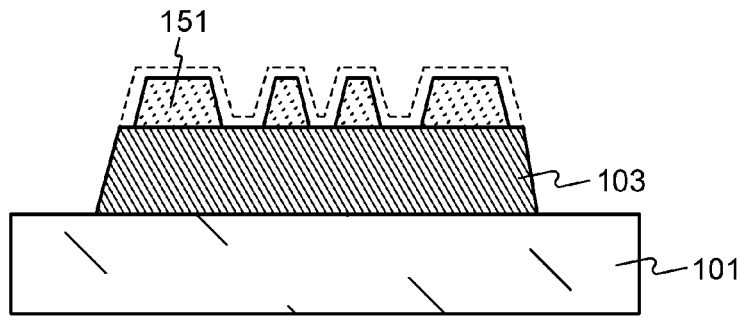

Next, the resist mask 150 is made to be reduced in size (to be receded) to form a resist mask 151 which is separated in a portion between the first protrusion 120a and the two second protrusions 130 and a portion between the first protrusion 120b and the two second protrusions 130 (see FIG. 12C). In order to reduce the size of (to recede) the resist mask 150, ashing by oxygen plasma may be employed.

Figure 12D:
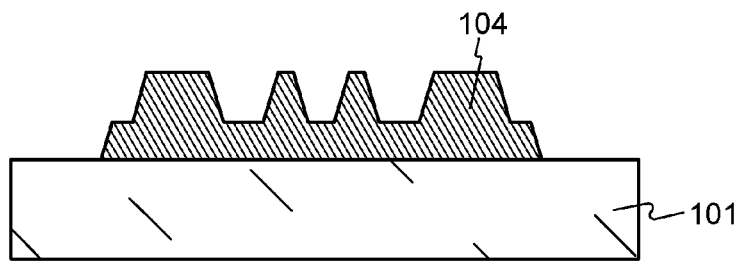

Next, the conductive film 103 which is processed into an island shape is etched with the use of the resist mask 151, so that the pair of first protrusions 120a and 120b and the two second protrusions 130 are formed, and the gate electrode 104 is formed. The resist mask 151 is removed after the etching (see FIG. 12D).

The following manufacturing process of the transistor 300 is similar to that for manufacturing the transistor 100 (see FIGS. 6A and 6B, FIGS. 7A and 7B, and FIGS. 8A and 8B).

The transistor 300 described in this embodiment includes the pair of first protrusions 120a and 120b and the plurality of second protrusions 130 of the gate electrode 104, so that the effective channel length L can be three times or more, further preferably five times or more, still further preferably 10 times or more the apparent channel length. Further, the effective channel width W can be three times or more, further preferably five times or more, still further preferably 10 times or more the apparent channel width. Accordingly, even in the case where the transistor is reduced in size, the short-channel effect can be reduced and the integration degree of the semiconductor device can be improved. Further, the semiconductor device at low manufacturing cost with high yield can be provided.

Note that the structure described in this embodiment can be combined with any of the structures described in other embodiments as appropriate.

[Embodiment 4]

In this embodiment, a transistor having a structure different from that of the transistor described in the above embodiment is described.

The gate electrode 104 in the transistor 100 can be considered to include one region in which the pair of first protrusions 120a and 120b and the second protrusion 130 are formed and the other region in which the pair of first protrusions 120a and 120b and the second protrusion 130 are not formed. An embodiment in which the two regions are formed using different conductive materials is described in this embodiment. A transistor in this embodiment is different from the transistor in Embodiment 1 only in the kinds of the conductive materials of the pair of first protrusions 120a and 120b and the kind of the conductive material of the second protrusion 130; therefore, Embodiment 1 can be referred to as appropriate.

A transistor 400 including the gate electrode 104 includes the pair of first protrusions 120a and 120b and the second protrusion 130 formed with a plurality kinds of conductive material is described as an example in this embodiment.

Figure 13A:
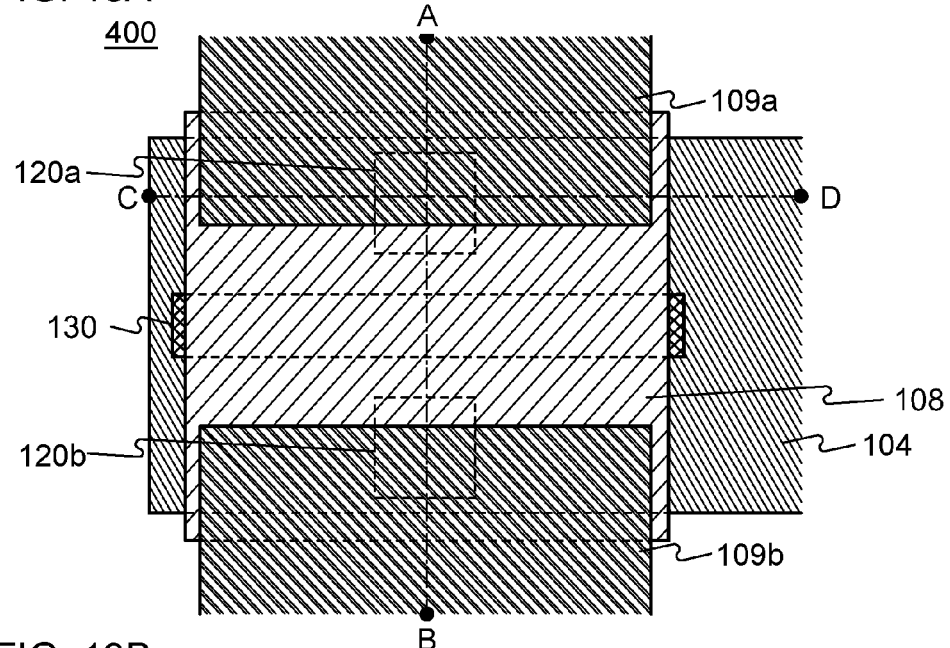
FIGS. 13A to 13C are a top view and cross-sectional views, respectively, which show an example of a semiconductor device according to one embodiment of the present invention.

FIG. 13A is a top view of the transistor 400.

The transistor 400 having a bottom gate structure includes the gate electrode 104 which includes, over the substrate 101, the pair of first protrusions 120a and 120b and the second protrusion 130 provided between the pair of first protrusions 120a and 120b; the gate insulating film 105 covering the gate electrode 104; the semiconductor film 108 which is in contact with the gate insulating film 105 and overlaps with the pair of first protrusions 120a and 120b and the second protrusion 130; and the pair of electrodes 109a and 109b which is in contact with the semiconductor film 108 and overlaps with the pair of first protrusions 120a and 120b. Note that the gate insulating film 105 is not shown in FIG. 13A for convenience.

In the direction of the channel width, the side edges of the semiconductor film 108 are on the outer sides than the top surfaces of the pair of first protrusions 120a and 120b of the gate electrode 104.

Further, in the direction of the channel width, the side edges of the pair of electrodes 109a and 109b are on the outer sides than the top surfaces of the pair of first protrusions 120a and 120b of the gate electrode 104.

Each of the three pairs of first protrusions 120a and 120b of the gate electrode 104 faces each other with the second protrusion 130 extending in the direction of the channel width provided therebetween.

Figure 13B:
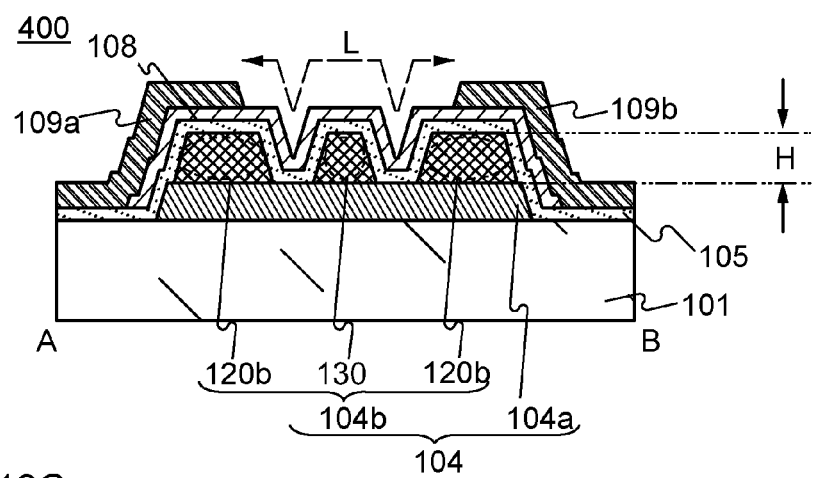

FIG. 13B is a cross-sectional view of the transistor 400 along dashed-dotted line A-B in FIG. 13A.

The transistor 400 in the cross section A-B shown in FIG. 13B includes the substrate 101; the gate electrode 104; the gate insulating film 105 covering the gate electrode 104; the semiconductor film 108 which is in contact with the gate insulating film 105 and overlaps with the gate electrode 104, the pair of first protrusions 120a and 120b, and the second protrusion 130; and the pair of electrodes 109a and 109b which is in contact with the semiconductor film 108 and overlaps with the pair of first protrusions 120a and 120b.

Further, the gate electrode 104 includes a region 104a and a region 104b which is provided to be in contact with the region 104a and includes the pair of first protrusions 120a and 120b and the second protrusion 130 which are separately formed. The regions 104a and 104b are formed using different conductive materials, and the regions 104a and 104b are formed using a first conductive material and a second conductive material, respectively.

The semiconductor film 108 in the transistor 400 is formed along the shape of the pair of first protrusions 120a and 120b and the second protrusion 130 which are the region 104b of the gate electrode 104. Accordingly, a three-dimensional channel region is formed in the transistor 400. Further, an effective channel length L which functions in operation of the transistor 400 is longer than an apparent channel length which corresponds to the distance between the pair of electrodes 109a and 109b in FIG. 13A by at least the height H of each of the first protrusion 120a, the first protrusion 120b, and the second protrusion 130 (see FIG. 13B).

Figure 13C:
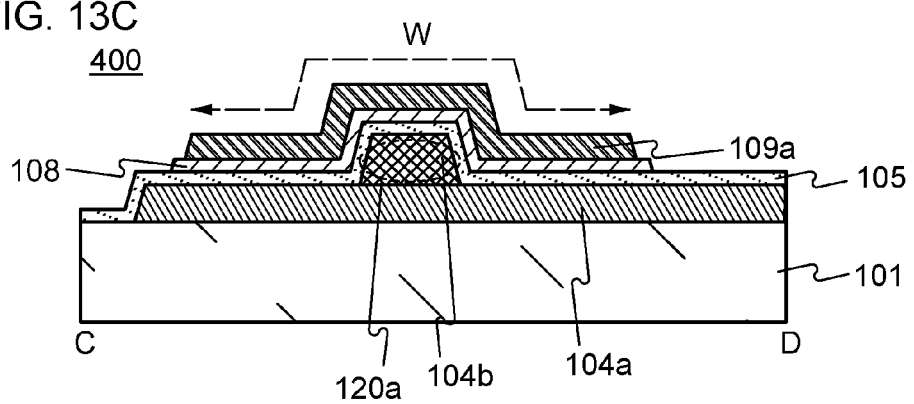

FIG. 13C is a cross-sectional view of the transistor 400 along dashed-dotted line C-D in FIG. 13A.

As shown in FIG. 13C, the transistor 400 in the cross section C-D includes the substrate 101; the gate electrode 104; the gate insulating film 105 covering the gate electrode 104, the semiconductor film 108; and the electrode 109a which is one of the pair of electrodes 109a and 109b. The semiconductor film 108 is in contact with the gate insulating film 105 and overlaps with the gate electrode 104 and the first protrusion 120a. The electrode 109a is in contact with the semiconductor film 108 and overlaps with the first protrusion 120a.

The gate electrode 104 includes the first protrusion 120a over the region 104a formed using the first conductive material. The first protrusion 120a is one of the pair of first protrusions 120a and 120b formed using the second conductive material, which are part of the region 104b.

The semiconductor film 108 of the transistor 400 is formed along the shape of the pair of first protrusions 120a and 120b which are part of the region 104b of the gate electrode 104. Accordingly, a three-dimensional channel region is formed in the transistor 400. Further, an effective channel width W which functions in operation of the transistor 400 is longer than an apparent channel width which corresponds to the width between the pair of electrodes 109a and 109b in FIG. 13A by at least the height H of each of the first protrusion 120a and the first protrusion 120b (see FIG. 13C).

As described in Embodiment 1, the height H of each of the first protrusion 120a, the first protrusion 120b, and the second protrusion 130 is selected so that the effective channel width W and the effective channel length L of the pair of first protrusions 120a and 120b and the second protrusion 130 are three times or more, further preferably five times or more, still further preferably 10 times or more the apparent channel width and the apparent channel length, respectively. Note that the height H of each of the first protrusion 120a and the first protrusion 120b is the same as the height H of the second protrusion 130 because the pair of first protrusions 120a and 120b and the second protrusion 130 are formed in the same manufacturing process.

A plurality of pairs of first protrusions and a plurality of the second protrusions of the gate electrode may be formed as described in Embodiments 2 and 3, and the number may be determined depending on the size of a transistor to be manufactured as appropriate. The plurality of pairs of first protrusions and the plurality of second protrusions are formed, so that the height of each pair of (each of) the first protrusions and the second protrusions can be lowered; therefore, the coverage of a film formed in the manufacturing process of the transistor can be improved.

That is, the effective channel length L of the transistor 400 is lengthened with reduced size, so that the short-channel effect is suppressed. Further, the effective channel width W of the transistor 400 is lengthened, so that the on-state current thereof is increased. Accordingly, the transistor 400 has excellent switching characteristics with sufficiently high on/off ratio.

Here, a manufacturing method for the transistor 400 is described. Since the cross sections A-B and C-D of the transistor 400 are similar to those of the transistor 100, the cross section A-B of the transistor 400 is described as an example.

Figure 14A:
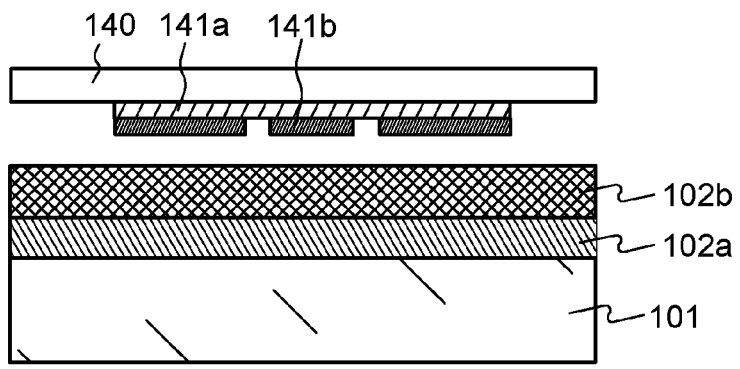
FIGS. 14A to 14D are cross-sectional views which show an example of a manufacturing method for a semiconductor device according to one embodiment of the present invention.

A conductive film 102a is formed using the first conductive material over the substrate 101. A conductive film 102b is formed using the second conductive material over the conductive film 102a (see FIG. 14A). A combined thickness of the conductive films 102a and 102b may be formed to be the thickness of the conductive film 102 described in Embodiment 1. Note that the thickness of the conductive film 102a may be thicker or thinner than that of the conductive film 102b.

The first conductive material and the second conductive material are similar to the conductive material applicable to the conductive film 102 described in Embodiment 1. In the case where the metal oxide described in Embodiment 1 is used as the first conductive material, an oxide film has resistance higher than a metal film; therefore, the second conductive material preferably has low sheet resistance of lower than or equal to 10 Ω/sq in order to reduce the total resistance of the gate electrode 104. Further, a difference in work function between the first conductive material and the second conductive material is preferably less than or equal to 0.6 eV, further preferably less than or equal to 0.2 eV, still further preferably less than or equal to 0.1 eV.

Figure 14B:
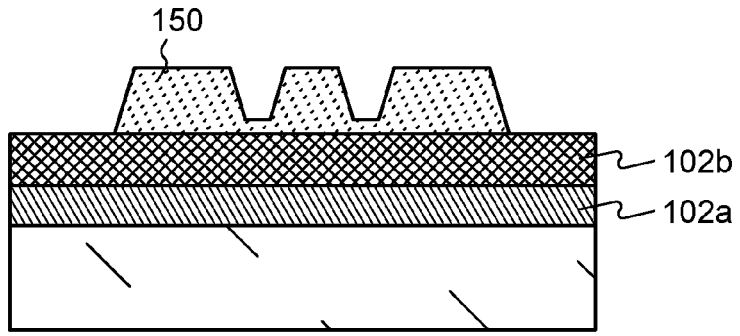

Next, the resist mask 150 is formed thick over a region in which the pair of first protrusions 120a and 120b and the second protrusion 130 are to be formed, and is formed thin over the other region with the use of a half-tone mask, similarly to FIG. 2B (see FIG. 14B). Note that the resist mask 150 is not formed over a region of the conductive film 102 over which the gate electrode 104 is not formed. The thickness of a region of the resist mask 150 which is formed thin is determined in consideration of the distance between the first protrusion 120a and the second protrusion 130 and the distance between the first protrusion 120b and the second protrusion 130.

In the case where a plurality of pairs of first protrusions 120a and 120b and a plurality of second protrusions 130 of the gate electrode 104 are formed, in a resist mask are formed to have regions with different thicknesses with the use of a multi-tone mask, a region with a large thickness is formed equivalently to the number of the pair of first protrusions 120a and 120b and the second protrusion 130, and a region with a small thickness is formed in the other region.

Next, part of the conductive films 102a and 102b are selectively removed (etched) with the use of the resist mask 150. A conductive film 103a which is processed into an island shape and a conductive film 103b which is processed into an island shape are formed by the etching. The etching may be performed by dry etching in which both of the conductive film 102a and the conductive film 102b can be etched.

Figure 14C:
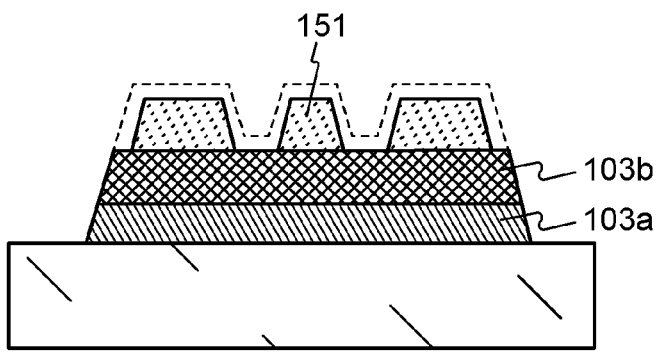

Next, the resist mask 150 is made to be reduced in size (to be receded) a resist mask 151 which is separated in a portion between the first protrusion 120a and the second protrusion 130 and a portion between the first protrusion 120b and the second protrusion 130 (see FIG. 14C). In order to reduce the size of (to recede) the resist mask 150, ashing by oxygen plasma may be employed.

Figure 14D:
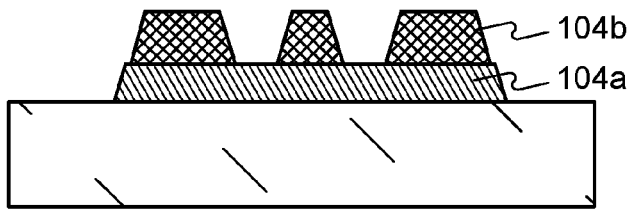

Next, the conductive film 103b which is processed into an island shape is etched with the use of the resist mask 151, so that the pair of first protrusions 120a and 120b and the second protrusion 130 are formed, and the gate electrode 104 which includes the regions 104a and 104b is formed. The resist mask 151 is removed after the etching (see FIG. 14D). Note that the etching condition where a selectivity ratio of the conductive film 103b which is processed into an island shape with respect to the conductive film 103a which is processed into an island shape is high needs to be employed.

The following manufacturing process of the transistor 400 is similar to that for manufacturing the transistor 100 (see FIGS. 6A and 6B, FIGS. 7A and 7B, and FIGS. 8A and 8B).

The transistor 400 described in this embodiment includes the gate electrode 104 which includes the region 104a formed using the first conductive material and the region 104b formed using the second conductive material. The region 104b includes the pair of first protrusions 120a and 120b and the plurality of second protrusions 130. Accordingly, the effective channel length L can be three times or more, further preferably five times or more, still further preferably 10 times or more the apparent channel length. Further, the effective channel width W can be three times or more, further preferably five times or more, still further preferably 10 times or more the apparent channel width. Accordingly, even in the case where the transistor is reduced in size, the short-channel effect can be suppressed and the integration degree of the semiconductor device can be improved. Further, the semiconductor device at low manufacturing cost with high yield can be provided.

Note that the structure described in this embodiment can be combined with any of the structures described in other embodiments as appropriate.

[Embodiment 5]

In this embodiment, a transistor having a structure different from that of the transistor described in the above embodiment is described.

One embodiment of the present invention is not limited to a bottom-gate transistor and may be a top-gate transistor a structure which has an insulating surface and includes a pair of first protrusions and a second protrusion. A top-gate transistor including a structure which has an insulating surface and includes the pair of first protrusions 120a and 120b and the second protrusion 130 is described in this embodiment. A transistor in this embodiment is a modification example of the transistor in Embodiment 1; therefore, Embodiment 1 can be referred to as appropriate.

Here, a transistor 500 in which a structure which has an insulating surface and includes the pair of first protrusions 120a and 120b and the second protrusion 130 is described as an example.

Figure 15A:
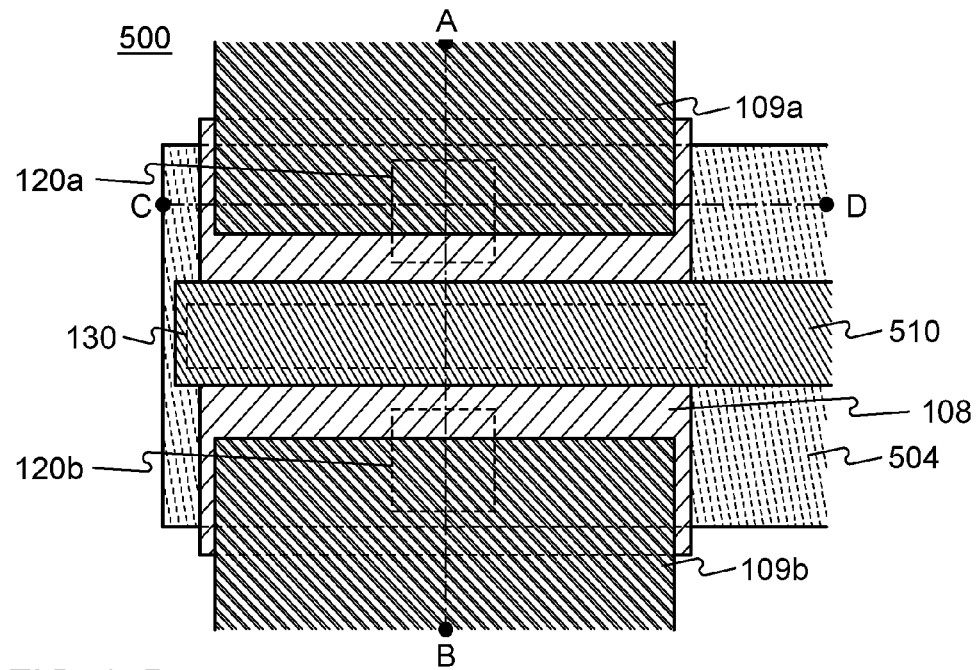
FIGS. 15A to 15C are a top view and cross-sectional views, respectively, which show an example of a semiconductor device according to one embodiment of the present invention.

FIG. 15A is a top view of the transistor 500.

The transistor 500 has a top gate structure and includes a structure 504 which has an insulating surface and includes, over the substrate 101, the pair of first protrusions 120a and 120b and the second protrusion 130 provided between the pair of first protrusions 120a and 120b; the semiconductor film 108 which is in contact with the pair of first protrusions 120a and 120b and the second protrusion 130; the pair of electrodes 109a and 109b which is in contact with the semiconductor film 108 and overlaps with the pair of first protrusions 120a and 120b; the gate insulating film 105 covering the structure 504, the semiconductor film 108, and the pair of electrodes 109a and 109b; and a gate electrode 510 which is in contact with the gate insulating film 105 and is provided between the pair of electrodes 109a and 109b. Note that in FIG. 15A, the gate insulating film 105 is not shown for convenience.

In the direction of the channel width, the side edges of the semiconductor film 108 are on the outer sides than the top surfaces of the pair of first protrusions 120a and 120b of the structure 504 which has an insulating surface.

Further, in the direction of the channel width, the side edges of the pair of electrodes 109a and 109b are on the outer sides than the top surfaces of the pair of first protrusions 120a and 120b of the structure 504 which has an insulating surface.

The pair of first protrusions 120a and 120b of the structure 504 which has an insulating surface faces each other with the second protrusion 130 extending in the direction of the channel width provided therebetween.

Figure 15B:
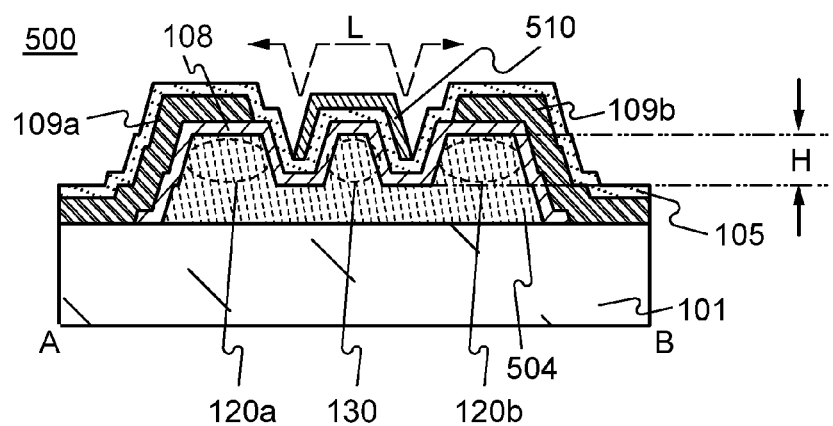

FIG. 15B is a cross-sectional view of the transistor 500 along dashed-dotted line A-B in FIG. 15A.

The semiconductor film 108 is formed along the shape of the pair of first protrusions 120a and 120b and the second protrusion 130 of the structure 504 which has an insulating surface. Accordingly, a three-dimensional channel region is formed in the transistor 500. Further, an effective channel length L which functions in operation of the transistor 500 is longer than an apparent channel length which corresponds to the distance between the pair of electrodes 109a and 109b in FIG. 15A by at least the height H of each of the first protrusion 120a, the first protrusion 120b, and the second protrusion 130 (see FIG. 15B).

The height H of each of the first protrusion 120a, the first protrusion 120b, and the second protrusion 130 corresponds to, in a perpendicular line that is drawn from top surfaces of the pair of first protrusions 120a and 120b and the second protrusion 130 perpendicularly to a bottom surface of the structure 504 which has an insulating surface, a distance between the top surfaces of the pair of first protrusions 120a and 120b and the top surface of a region where neither the second protrusion 130 and the pair of first protrusions 120a and 120b nor the second protrusion 130 of the structure 504 which has an insulating surface is provided.

Figure 15C:
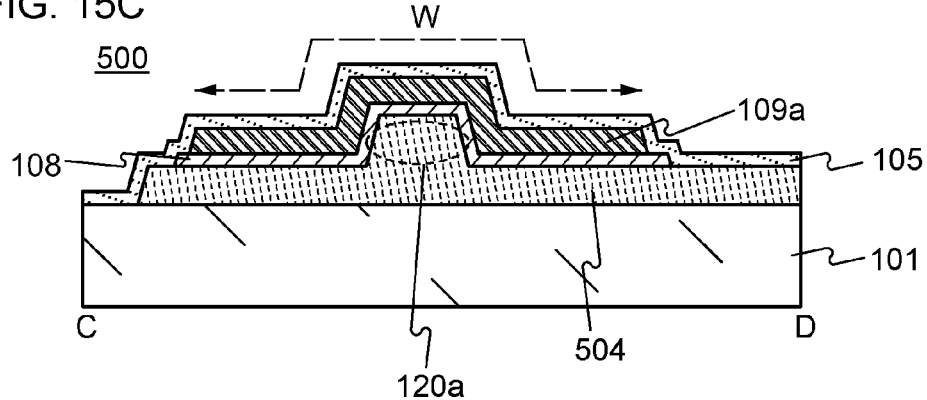

FIG. 15C is a cross-sectional view of the transistor 500 along dashed-dotted line C-D in FIG. 15A.

As shown in FIG. 15C, the transistor 500 in the cross section C-D includes the substrate 101, the structure 504 which has an insulating surface and includes the first protrusion 120a which is one of the pair of first protrusions 120a and 120b, the semiconductor film 108 covering the first protrusion 120a, the electrode 109a which is one of the pair of electrodes 109a and 109b, the gate insulating film 105 covering the structure 504 which has an insulating surface, the semiconductor film 108, and the electrode 109a.

The semiconductor film 108 is formed along the shape of the pair of first protrusions 120a and 120b of the structure 504 which has an insulating surface. Accordingly, a three-dimensional channel region is formed in the transistor 500. Further, an effective channel width W which functions in operation of the transistor 500 is longer than an apparent channel width which corresponds to the width between the pair of electrodes 109a and 109b in FIG. 15A by at least the height H of each of the first protrusion 120a and the first protrusion 120b (see FIG. 15C). In this manner, the transistor 500 can be reduced in size and the on-state current thereof can be increased.

As described in Embodiment 1, the height H of each of the first protrusion 120a, the first protrusion 120b, and the second protrusion 130 is selected so that the effective channel width W and the effective channel length L of the pair of first protrusions 120a and 120b and the second protrusion 130 are three times or more, further preferably five times or more, still further preferably 10 times or more the apparent channel width and the apparent channel length, respectively.

A plurality of pairs of first protrusions and a plurality of second protrusions of the gate electrode may be formed as described in Embodiment 2 and 3, and the number may be determined depending on the size of a transistor to be manufactured as appropriate. The plurality of pairs of first protrusions and the plurality of second protrusions are formed, so that the height of each pair of (each of) the first protrusions and the second protrusions can be lowered; therefore, the coverage of a film formed in the manufacturing process of the transistor can be improved.

That is, the transistor 500 is reduced in size, the effective channel length L is lengthened, and the short-channel effect can be suppressed. Further, the effective channel width W of the transistor 500 is lengthened and the on-state current thereof can be increased. Accordingly, the transistor 500 has excellent switching characteristics with sufficiently high on/off ratio.

The pair of electrodes 109a and 109b and the gate electrode 510 do not overlap with each other in the transistor 500 shown in FIGS. 15A to 15C; however, the structure is not limited thereto. For example, the pair of electrodes 109a and 109b and the gate electrode 510 may overlap with each other.

Although not shown, the transistor 500 may include, as an LDD region, a low-resistance region to which a dopant is added in a region of the semiconductor film 108, which does not overlap with the pair of electrodes 109a and 109b and the gate electrode 510. By providing the LDD regions, degradation of the transistor 500, such as hot-carrier degradation, can be suppressed, and reliability of the transistor 500 can be improved. Further, the parasitic capacitance generated between the electrode 109a the gate electrode 510 and between the electrode 109b and the gate electrode 510 can be reduced, so that the transistor 500 can operate at high speed.

The structure of the transistor 500 is not limited to the structure shown in FIGS. 15A to 15C. For example, the transistor 500 shown in FIGS. 15A to 15C has a top-contact structure in which the bottom surfaces of the pair of electrodes 109a and 109b are in contact with the top surface of the semiconductor film 108. The structure in which the top surfaces of the pair of electrodes 109a and 109b are in contact with the bottom surface of the semiconductor film 108 may be used. The positions of the side edges of the semiconductor film 108, the pair of first protrusions 120a and 120b, the second protrusion 130, and the pair of electrodes 109a and 109b in the channel length and the direction of the channel width can be selected as appropriate as described in Embodiment 1.

Here, a manufacturing method for the transistor 500 is described. Note that the cross section A-B of the transistor 500 is described as an example.

Figure 16A:
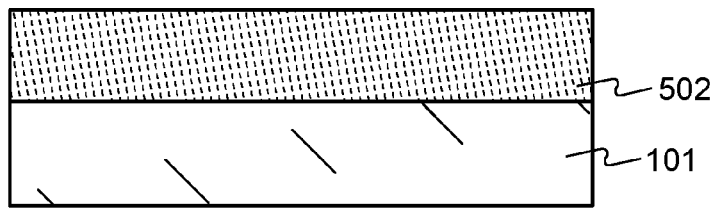
FIGS. 16A to 16D are cross-sectional views which show an example of a manufacturing method for a semiconductor device according to one embodiment of the present invention.

The substrate 101 may be formed in a similar manner to Embodiment 1, and an insulating film 502 is formed using an insulating material over the substrate 101 (see FIG. 16A). The thickness of the insulating film 502 is similar to that of the conductive film 102 described in Embodiment 1.

The insulating film 502 needs to be formed using a material which can resist the following heat treatment. For example, an organic compound such as polyimide or an inorganic compound such as silicon oxide, silicon oxynitride, silicon nitride oxide, silicon nitride, aluminum oxide, aluminum oxynitride, aluminum nitride oxide, or aluminum nitride may be used as the insulating film 502.

In the case of using an oxide film as the semiconductor film 108 in the transistor 500, a film from which oxygen is released by heat treatment is preferably used as the insulating film 502. The oxide semiconductor film 107 to be formed later is supplied with oxygen with the use of the film from which oxygen is released by heat treatment, and the interface states between the structure 504 which has an insulating surface and the oxide semiconductor film 107 to be formed later can be reduced. Accordingly, electric charge or the like generated due to operation of the transistor 500 can be prevented from being trapped at the interface state; therefore, the transistor 500 can be a transistor with less deterioration in electric characteristics.

A base insulating film may be formed between the substrate 101 and the insulating film 502. The base insulating film prevents diffusion of an impurity (e.g., an alkali metal such as Li or Na) from the substrate 101 and etching of the substrate 101 in an etching step in a manufacturing process of the transistor 500. Although not particularly limited, the thickness of the base insulating film is preferably greater than or equal to 50 nm.

The base insulating film may be any films as long as the film can be used for the gate insulating film 105. In order to prevent entry of an alkali metal, a nitride insulating film to be described later is preferably used as the base insulating film.

Figure 16B:
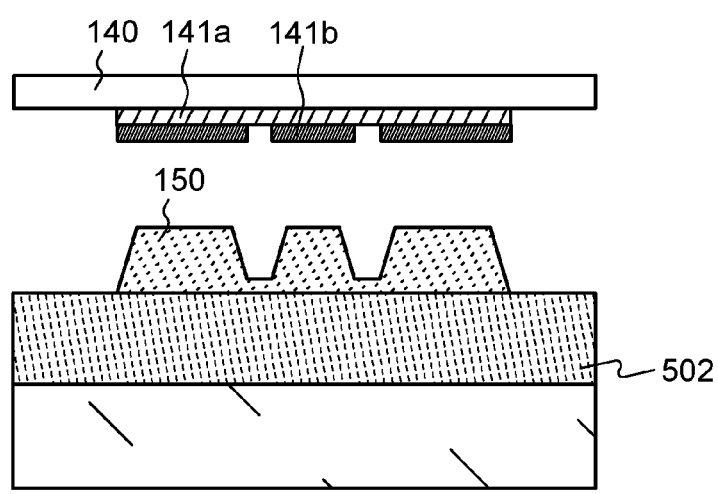

The resist mask 150 having regions with different thicknesses is formed with the use of a half-tone mask in a similar manner to Embodiment 1. The resist mask 150 is formed thick over a region in which the pair of first protrusions 120a and 120b and the second protrusion 130 are to be formed, and is formed thin over the other region (see FIG. 16B). Note that the resist mask 150 is not formed over a region of the conductive film 102 over which the gate electrode 104 is not formed. The thickness of a region of the resist mask 150 which is formed thin may be determined in consideration of the distance between the first protrusion 120a and the second protrusion 130 and the distance between the first protrusion 120b and the second protrusion 130. Note that another multi-tone mask such as a gray-tone mask may be used instead of a half-tone mask.

In the case where a plurality of pairs of first protrusions 120a and 120b and a plurality of second protrusions 130 of the structure 504 which has an insulating surface are formed, in a resist mask are formed to have regions with different thicknesses with the use of a multi-tone mask, a region with a large thickness is formed equivalently to the number of the pair of first protrusions 120a and 120b and the second protrusion 130, and a region with a small thickness is formed in the other region.

Part of the insulating film 502 is selectively removed (etched) with the use of the resist mask 150. An insulating film 503 which is processed into an island shape is formed by the etching. The etching may be performed by dry etching.

Figure 16C:
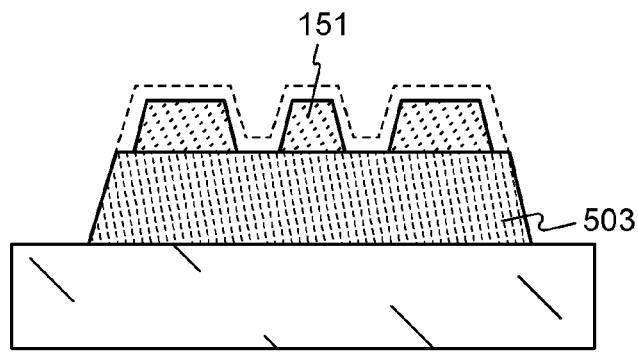

Next, the resist mask 150 is made to be reduced in size (to be receded) to form a resist mask 151 which is separated in a portion between the first protrusion 120a and the second protrusion 130 and a portion between the first protrusion 120b and the second protrusion 130 (see FIG. 16C). In order to reduce the size of (to recede) the resist mask 150, ashing by oxygen plasma may be employed.

Figure 16D:
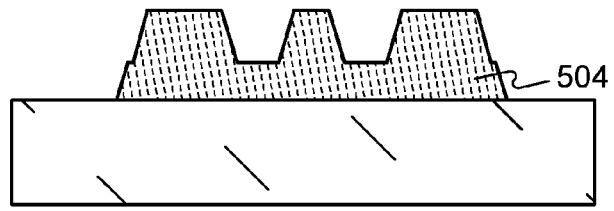

Next, the insulating film 503 which is processed into an island shape is etched with the use of the resist mask 151, so that the pair of first protrusions 120a and 120b and the second protrusion 130 are formed, and the structure 504 which has an insulating surface is formed. The resist mask 151 is removed after the etching (see FIG. 16D).

After the structure 504 which has an insulating surface is formed, plasma treatment such as reverse sputtering treatment may be performed. With such treatment, the upper portions of the pair of first protrusions 120a and 120b and the second protrusion 130 are rounded to have a curved surface. Accordingly, the coverage of a film formed in the following manufacturing process of the transistor 500 can be improved.

Figure 17A:
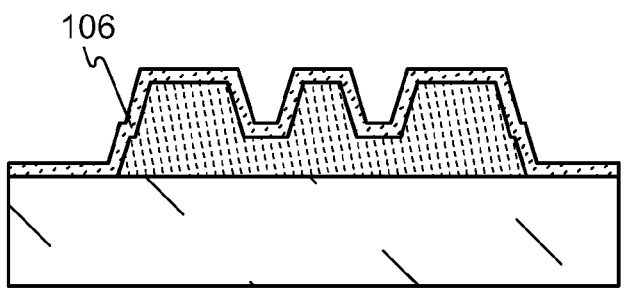
FIGS. 17A to 17D are cross-sectional views which show an example of a manufacturing method for a semiconductor device according to one embodiment of the present invention.

The oxide semiconductor film 106 is formed to cover the structure 504 which has an insulating surface. The oxide semiconductor film 106 is formed in a similar manner to Embodiment 1 (see FIG. 17A).

Figure 17B:
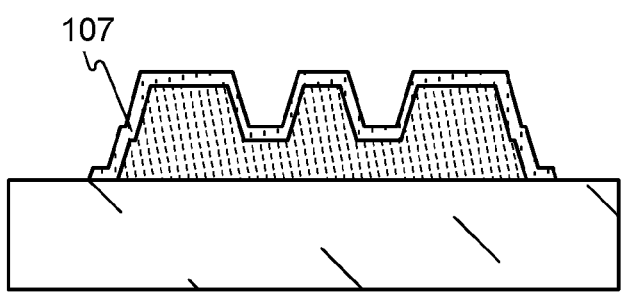

A resist mask is formed over the oxide semiconductor film 106 by a photolithography step, and the oxide semiconductor film 106 is etched into a desired shape with the use of the resist mask; then, the oxide semiconductor film 107 having an island shape is formed (see FIG. 17B). The etching may be performed by dry etching or wet etching.

Figure 17C:
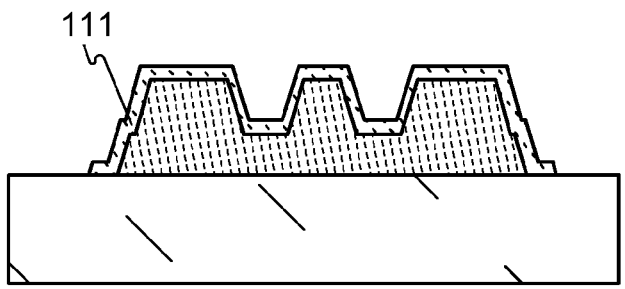

The first heat treatment is performed so that hydrogen (including water, a hydroxyl group, and hydride) is released from the first oxide semiconductor film 107, part of oxygen contained in the gate insulating film 105 is released, and oxygen is diffused into the first oxide semiconductor film 107 and into the vicinity of an interface between the gate insulating film 105 and the first oxide semiconductor film 107; then, the oxide semiconductor film 111 is formed (see FIG. 17C). Note that the oxide semiconductor film 111 corresponds to the semiconductor film 108 shown in FIGS. 15A to 15C. Further, as described in Embodiment 1, the semiconductor film 108 may be formed using another material having semiconductor characteristics instead of the oxide semiconductor film 111.

Further, with the first heat treatment, the interface states between the gate insulating film 105 and the oxide semiconductor film 107 and oxygen deficiency of the oxide semiconductor film 107 are reduced, and the influence of carrier trapping at the interface between the oxide semiconductor film 111 and the gate insulating film 105 in the transistor 500 can be reduced.

The conditions and the apparatus of the first heat treatment are the same as those in Embodiment 1.

The hydrogen concentration of the oxide semiconductor film 111 formed through the first heat treatment is similar to that in Embodiment 1. Contents of an alkali metal and an alkaline earth metal are preferably small in the oxide semiconductor film 111 because they are impurities for the oxide semiconductor film 111. The alkali metal concentration in the oxide semiconductor film 111 is similar to that in Embodiment 1.

In the manufacturing process of the transistor 500, the timing of the first heat treatment is not limited to the timing after the oxide semiconductor film 107 is formed. The first heat treatment may be performed any time after the oxide semiconductor film 106 is formed. The heat treatment may be performed plural times. For example, the heat treatment may be performed not only once after formation of the oxide semiconductor film 107 but also twice after formation of the oxide semiconductor film 106 and after formation of the oxide semiconductor film 107.

Figure 17D:
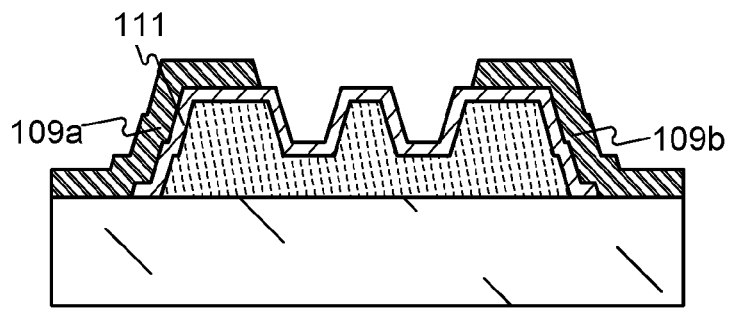

Next, the pair of electrodes 109a and 109b is formed over the oxide semiconductor film 111 (see FIG. 17D). The pair of electrodes 109a and 109b may be formed in a similar manner to Embodiment 1. Note that the pair of electrodes 109a and 109b functions as a source electrode and a drain electrode, and also functions as a source line and a drain line.

Figure 18A:
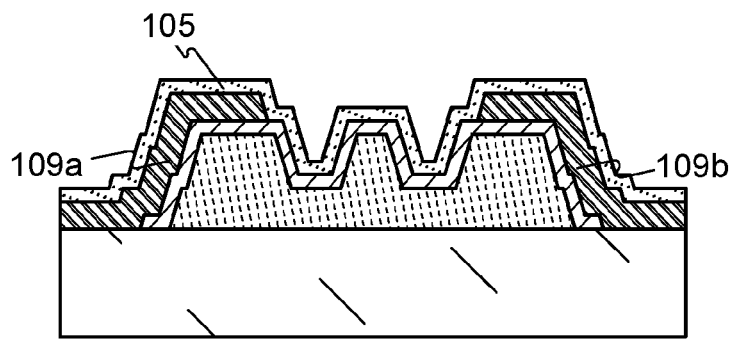
FIGS. 18A to 18C are cross-sectional views which show an example of a manufacturing method for a semiconductor device according to one embodiment of the present invention.

The gate insulating film 105 is formed to cover the structure 504 which has an insulating surface, the oxide semiconductor film 111, and the pair of electrodes 109a and 109b (see FIG. 18A). The material of the gate insulating film 105 may be formed using materials that can be used for the gate insulating film 105 described in Embodiment 1.

Figure 18B:
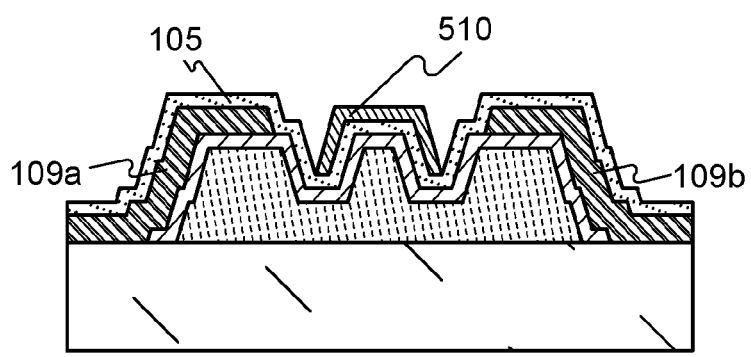

The gate electrode 510 is formed to be in contact with the gate insulating film 105 and overlaps with the second protrusion 130 (see FIG. 18B). The gate electrode 510 is formed as follows: a conductive film is formed using a conductive material which is applicable to the gate electrode 104 described in Embodiment 1, and a photolithography step is performed on the conductive film. The thickness of the gate electrode 510 may be similar to the thickness of the electrode 109a or the thickness of the electrode 109b.

In the case where a low-resistance region to which a dopant is added is provided as an LDD region in a region of the semiconductor film 111 which does not overlap with the pair of electrodes 109a and 109b and the gate electrode 510, a dopant is added with the use of the pair of electrodes 109a and 109b and the gate electrode 510 as masks, so that the low-resistance region can be formed in a self-aligned manner. As the dopant, an element imparting a conductivity type may be added by an ion doping method or an ion implantation method can be used.

Figure 18C:
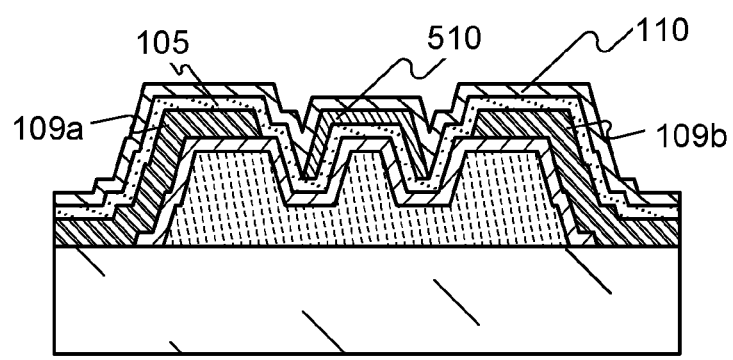

With the above steps, the transistor 500 can be formed. Note that after the manufacturing process, the protective insulating film 110 may be formed (see FIG. 18C). The protective insulating film 110 may be formed in a similar manner to that of the gate insulating film 105. Further, second heat treatment may be performed after the protective insulating film 110 is formed. By the second heat treatment, part of oxygen in the base insulating film, part of oxygen of the structure 504 which has an insulating surface, part of oxygen in the gate insulating film 105, and part of oxygen in the protective insulating film 110 can be diffused in the oxide semiconductor film 111, in the vicinity of the interface between the base insulating film and the oxide semiconductor film 111, in the vicinity of the interface between the gate insulating film 105 and the oxide semiconductor film 111, and in the vicinity of the interface between the gate insulating film 105 and the protective insulating film 110. Accordingly, the electric characteristics of the transistor 500 can be improved. The apparatus and the heat condition of the second heat treatment may be similar to those of the first heat treatment.

Since the structure 504 which has an insulating surface includes the pair of first protrusions 120a and 120b and the second protrusion 130, the effective channel length can be three times or more, further preferably five times or more, still further preferably 10 times or more the apparent channel length, which is the distance between the pair of electrodes 109a and 109b in the top view. The effective channel width can be three times or more, further preferably five times or more, still further preferably 10 times or more the apparent channel width, which is the distance between the width between the pair of electrodes 109a and 109b in the top view. Accordingly, even in the case where the transistor is reduced in size, the influence caused by the short-channel effect can be suppressed and the integration degree of the semiconductor device can be improved. Further, the semiconductor device at low manufacturing cost with high yield can be provided.

Note that the structure described in this embodiment can be combined with any of the structures described in other embodiments as appropriate.

[Embodiment 6]

In this embodiment, an example of manufacturing a semiconductor memory device using the transistor described in any of Embodiments 1 to 5 is described.

As typical examples of a volatile semiconductor memory device, there are a dynamic random access memory (DRAM) which stores data in such a manner that a transistor included in a memory element is selected and electric charge is accumulated in a capacitor, and a static random access memory (SRAM) which holds stored data using a circuit such as a flip-flop.

As a typical example of a nonvolatile semiconductor memory device, there is a flash memory which includes a floating gate between a gate electrode and a channel formation region in a transistor and stores data by holding electric charge in the floating gate.

The transistor described in any of Embodiments 1 to 5 can be applied to part of transistors included in the above-described semiconductor memory device.

First, a memory cell which is a semiconductor memory device to which the transistor described in any of Embodiments 1 to 5 is applied is described with reference to FIGS. 19A and 19D.

Figure 19A:
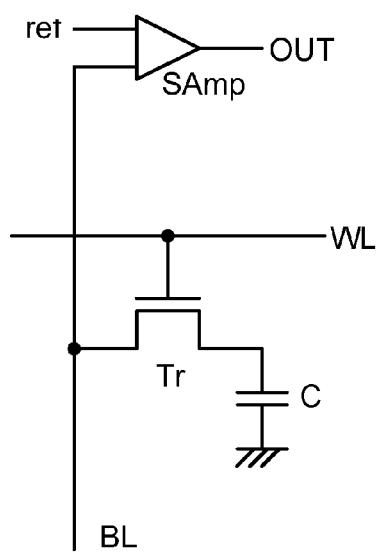
FIG. 19A is a circuit diagram of an example of a semiconductor device including a transistor according to one embodiment of the present invention.

A memory cell includes a bit line BL, a word line WL, a sense amplifier SAmp, a transistor Tr, and a capacitor C (see FIG. 19A).

The size of the transistor Tr needs to be smaller as the integration degree of the semiconductor memory device becomes higher; however, the short-channel effect of the transistor Tr cannot be ignored when the size of transistor Tr is simply reduced and becomes smaller than a certain size. This is because a leakage current due to a punch-through phenomenon is likely to flow because of the short-channel effect, and the transistor does not function as a switching element.

Application of the transistor according to one embodiment of the present invention to the transistor Tr can achieve a smaller occupied area of the transistor Tr and a longer effective channel length the transistor Tr. Accordingly, the integration degree of the semiconductor device can be further improved.

Figure 19B:
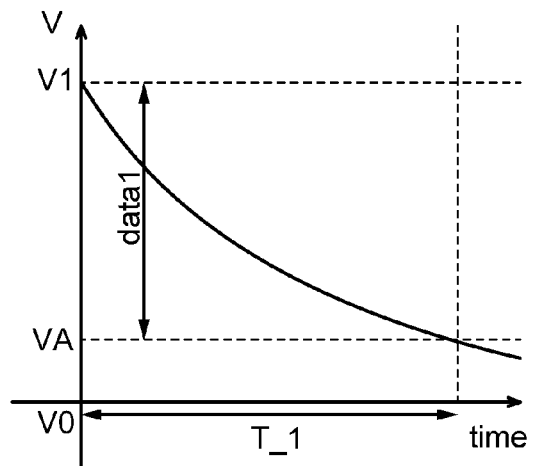
FIG. 19B is a view showing change of a holding potential over time of a semiconductor device including a transistor according to one embodiment of the present invention.

It is known that the potential held in the capacitor is gradually decreased with time as shown in FIG. 19B owing to the off-state current of the transistor Tr. After a certain period of time, the potential originally charged from V0 to V1 is reduced to VA that is a limit for reading out data 1. This period is called a holding period T_1. In the case of a two-level memory cell, refresh needs to be performed within the holding period T_1.

When an oxide semiconductor film is used as the semiconductor film having a channel region of the transistor Tr, the off-state current of the transistor including the oxide semiconductor film is small and therefore the holding period T_1 can be longer. That is, the intervals between refresh operations can be longer. Accordingly, power consumption can be reduced. For example, in the case where a memory cell is formed using a transistor including an oxide semiconductor film with an off-state current of $1\times10^{-21}$ A or less, preferably $1\times10^{-24}$ A or less as described in Embodiment 1, data can be kept for several days to several tens of years without supply of electric power.

Figure 19C:
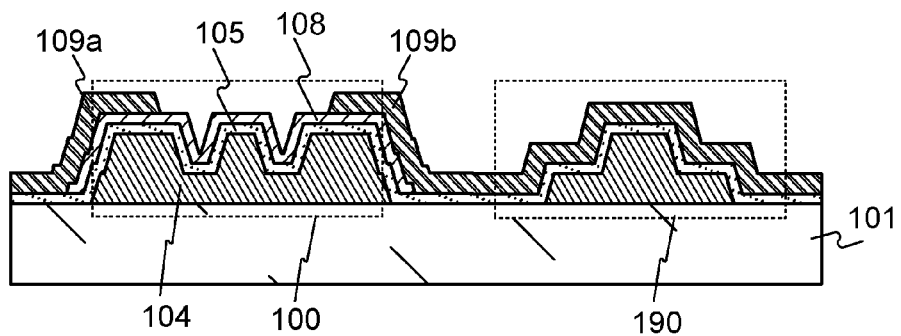
FIGS. 19C and 19D are cross-sectional views of examples of semiconductor devices each including a transistor according to one embodiment of the present invention.
Figure 19D:
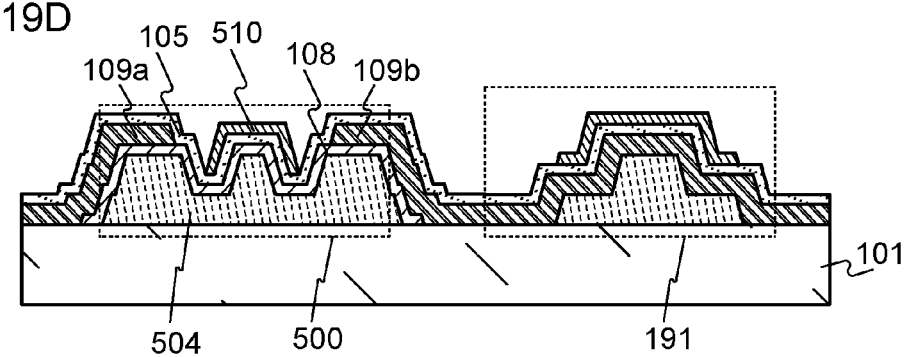

An example of the cross sectional structure of a memory cell including the transistor described in any of Embodiments 1 and 5 is described in FIGS. 19C and 19D. Although any transistor described in any of Embodiments 1 to 5 can be applied, the transistors 100 and 500 are applied in FIGS. 19C and 19D, respectively, as an example.

FIG. 19C shows a cross-sectional structure of the transistor 100 including the semiconductor film 108 and a capacitor 190 which are formed over the substrate 101. Note that the capacitor 190 includes a first capacitor electrode, a second capacitor electrode, and a dielectric layer. The first capacitor electrode is formed using the same layer and the same material as the gate electrode 104. The second capacitor electrode is connected to the gate electrode 109b which is one of the pair of electrodes 109a and 109b. The dielectric layer is formed using the same layer and the same material as the gate insulating film 105 and is provided between the first capacitor electrode and the second capacitor electrode. When one embodiment of the present invention is applied to both the transistor 100 and the capacitor 190, a three-dimensional capacitor can be formed; therefore, the occupied area of the capacitor can be reduced.

FIG. 19D shows a cross-sectional structure of the transistor 500 including the semiconductor film 108 and a capacitor 191 which are formed over the substrate 101. The capacitor 191 includes a first capacitor electrode, a second capacitor electrode, and a dielectric layer. The first capacitor electrode is formed using the same layer and the same material as the gate electrode 510. The second capacitor electrode is connected to the gate electrode 109b which is one of the pair of electrodes 109a and 109b in the transistor 500. The dielectric layer is formed using the same layer and the same material as the gate insulating film 105 and is provided between the first capacitor electrode and the second capacitor electrode of the transistor 500. When one embodiment of the present invention is applied to both the transistor 500 and the capacitor 191, a three-dimensional capacitor can be formed; therefore, the occupied area of the capacitor can be reduced.

As described above, one embodiment of the present invention can be applied to a capacitor. Although not shown, the above structure of a capacitor may be applied to any of the other embodiments.

As described above, according to one embodiment of the present invention, even when the integration degree of a semiconductor memory device can be increased, the short-channel effect is suppressed. Accordingly, a semiconductor memory device with high reliability for a long time and low power consumption can be obtained.

Next, another example of the memory cell which is a semiconductor memory device to which the transistor described in any of Embodiments is applied 1 to 5, which is different from the memory cell described in FIGS. 19A and 19D, is described with reference to FIGS. 20A and 20B.

Figure 20A:
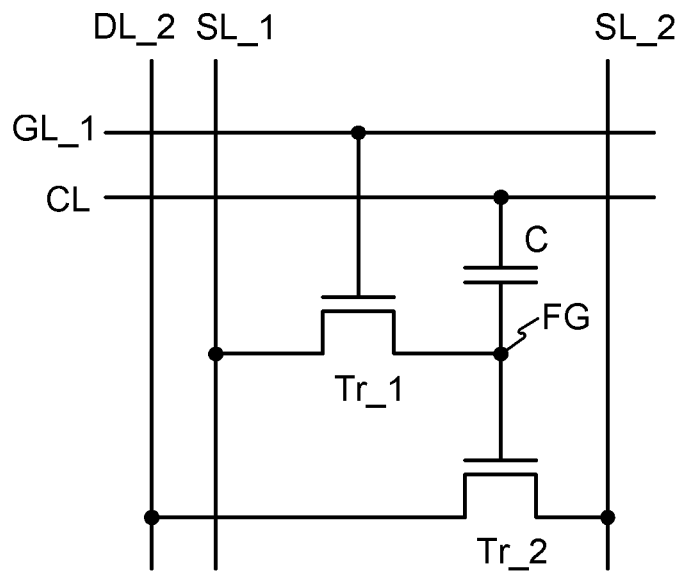
FIG. 20A is a circuit diagram showing an example of a semiconductor device including a transistor according to one embodiment of the present invention.
Figure 20B:
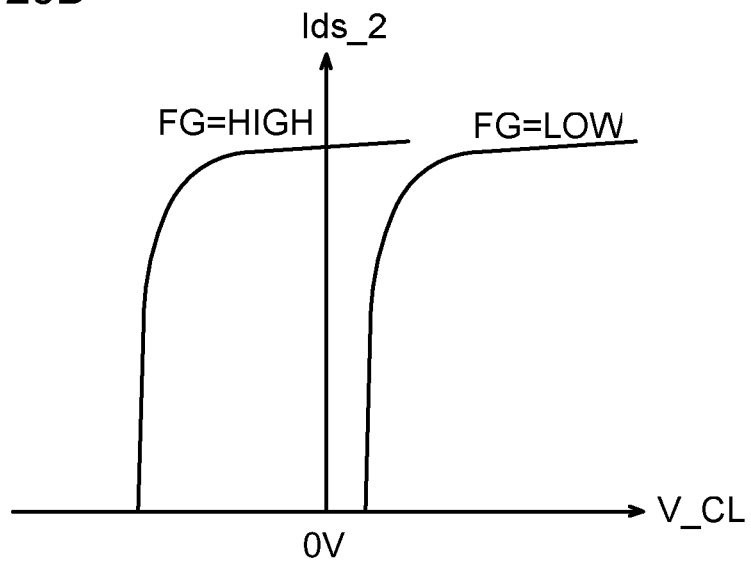
FIG. 20B is a view which shows relation between a holding potential and a drain current of a semiconductor device including a transistor according to one embodiment of the present invention.

FIG. 20A is a circuit diagram of a memory cell. A memory cell includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a floating gate FG connected to the other terminal of the capacitor C, a drain of the transistor Tr_1, and a gate of the transistor Tr_2.

As similar to a semiconductor memory element shown in FIG. 19A, the size of transistor Tr_1 and the transistor Tr_2 needs to be smaller as the integration degree of the semiconductor memory device shown in FIG. 20A becomes higher. The semiconductor memory device shown in FIG. 20A has more transistors than the semiconductor memory element shown in FIG. 19A; therefore, the size of the transistor needs to be further reduced in order to increase the integration degree.

By application of the transistor according to one embodiment of the present invention to the transistor Tr_1 and the transistor Tr_2, the occupied area of the transistor Tr is made smaller and the transistor Tr can have a longer effective channel length. Accordingly, the integration degree of the semiconductor device can be further improved.

The semiconductor memory device described in this embodiment utilizes variation in the threshold of the transistor Tr_2 in accordance with the potential of the floating gate FG. For example, FIG. 20B shows a relation between a potential V_CL of the capacitor line CL and a drain current Ids_2 flowing through the transistor Tr_2.

Here, the potential of the floating gate FG can be adjusted through the transistor Tr_1. For example, the potential of the source line SL_1 is set to VDD. In this case, when the potential of the gate line GL_1 is set to be higher than or equal to the potential obtained by adding VDD to the threshold voltage Vth of the transistor Tr_1, the potential of the floating gate FG can be HIGH. Further, when the potential of the gate line GL_1 is set to be lower than or equal to the threshold voltage Vth of the transistor Tr_1, the potential of the floating gate FG can be LOW.

Thus, either a V_CL-Ids_2 curve (FG=LOW) or a V_CL-Ids_2 curve (FG=HIGH) can be obtained. That is, when FG=LOW, Ids_2 is small at a V_CL of 0V; accordingly, data 0 is stored. Further, when FG=HIGH, Ids_2 is large at a V_CL of 0V; accordingly, data 1 is stored. In this manner, data can be stored.

When the transistor in which an oxide semiconductor film is used as a semiconductor film having a channel region is employed as the transistor Tr_1, unintentional leak of electric charge accumulated in the floating gate FG through the transistor Tr_1 can be suppressed because the off-state current of the transistor is extremely small. Therefore, data can be held for a long period.

A transistor in which an oxide semiconductor film is used as a semiconductor film having a channel region may be used as the transistor Tr_2.

Next, a structure of the semiconductor memory device shown in FIG. 20A without a capacitor is described with reference to FIG. 21.

Figure 21:
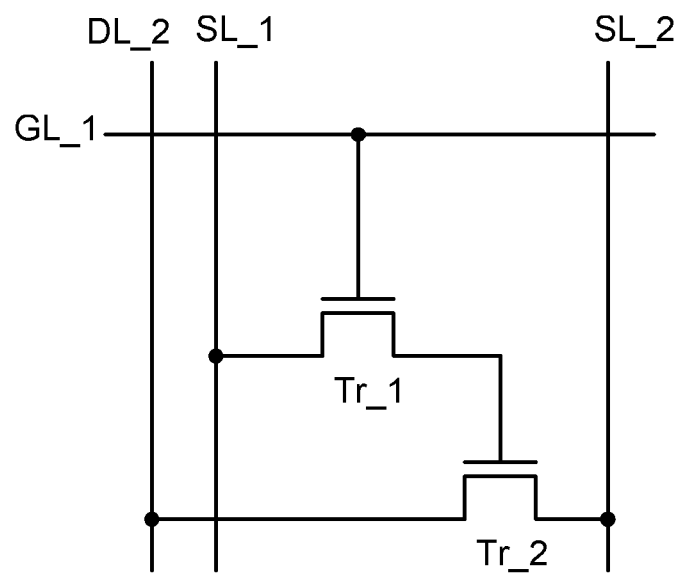
FIG. 21 is a circuit diagram showing an example of a semiconductor device including a transistor according to one embodiment of the present invention.

FIG. 21 is a circuit diagram of a memory cell. The memory cell includes the transistor Tr_1, a gate line GL_1 connected to the gate of the transistor Tr_1, the source line SL_1 connected to the source of the transistor Tr_1, the transistor Tr_2, the source line SL_2 connected to the source of the transistor Tr_2, and the drain line DL_2 connected to the drain of the transistor Tr_2. The gate of the transistor Tr_2 is connected to the drain of the transistor Tr_1.

When an oxide semiconductor film is used as a semiconductor film having a channel region of the transistor Tr_1, electric charge can be held between the drain of the transistor Tr_1 and the drain of the transistor Tr_2. The structure without the capacitor makes it possible to reduce an area of a memory, and the integration degree can be more increased than that of the structure with a capacitor.

The sizes of the transistor Tr_1 and the transistor Tr_2 need to be smaller as the integration degree of the semiconductor memory device becomes higher. The size of the transistor with the structure with a capacitor needs to be further reduced.

By application of the transistor according to one embodiment of the present invention to at least one of the transistor Tr_1 and the transistor Tr_2, the occupied area of the transistor Tr is made smaller and the transistor Tr can have a longer effective channel length. Accordingly, the integration degree can be further improved.

Although the semiconductor memory device including four or five lines is described in this embodiment, a structure of the semiconductor memory device is not limited thereto. For example, a structure in which one line functions as the source line SL_1 and the drain line DL_2 may be employed.

As described above, according to one embodiment of the present invention, even in the case where the integration degree of a semiconductor memory device can be increased, the short-channel effect is suppressed. Accordingly, a semiconductor device with high reliability for a long time and low power consumption can be obtained.

This embodiment can be implemented in appropriate combination with the other embodiments.

[Embodiment 7]

A central processing unit (CPU) can be formed by applying any of the semiconductor devices in Embodiments 1 to 6 as part thereof.

Figure 22A:
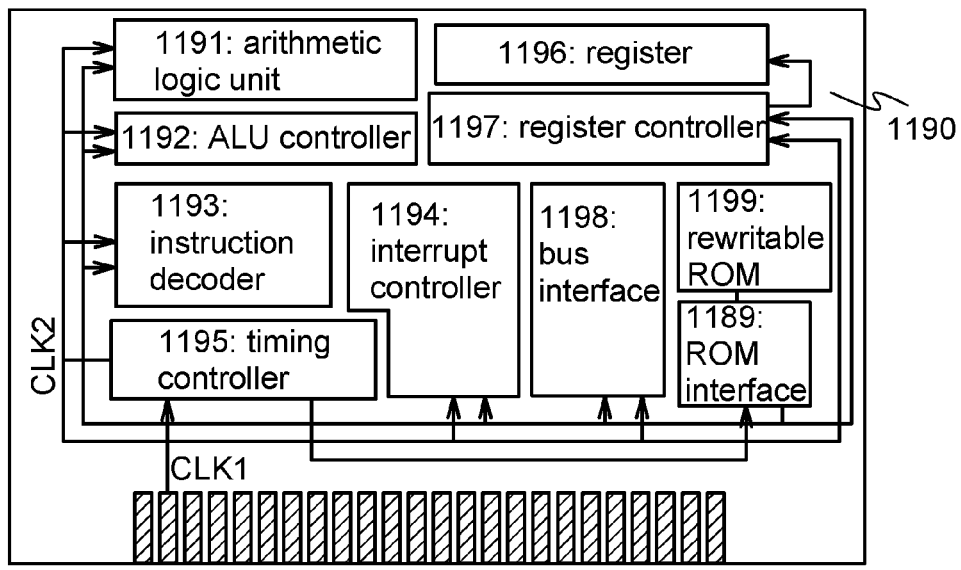
FIG. 22A is a block diagram which shows a specific example of a CPU including a transistor according to one embodiment of the present invention.

FIG. 22A is a block diagram illustrating a specific structure of a CPU. The CPU shown in FIG. 22A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 22A is just an example in which a configuration is simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU shown in FIG. 22A, a memory element is provided in the register 1196. Any memory element described in Embodiment 6 can be used as the memory element provided in the register 1196.

In the CPU shown in FIG. 22A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 22B:
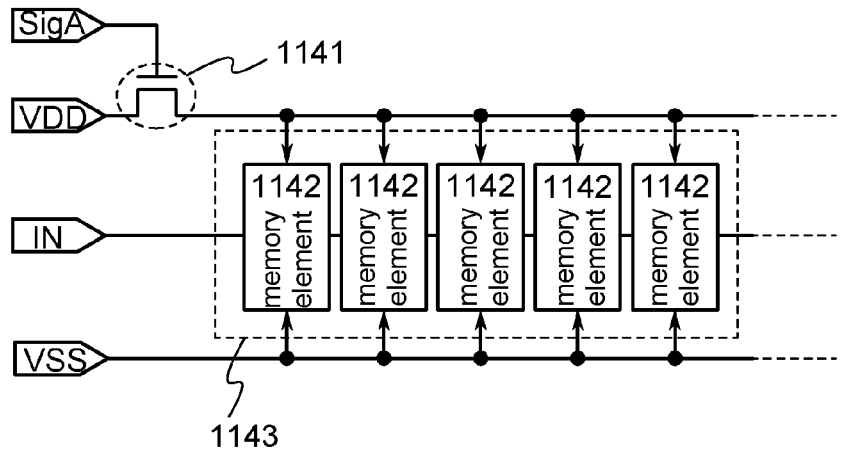
FIGS. 22B and 22C are circuit diagrams each showing part of the specific example.
Figure 22C:
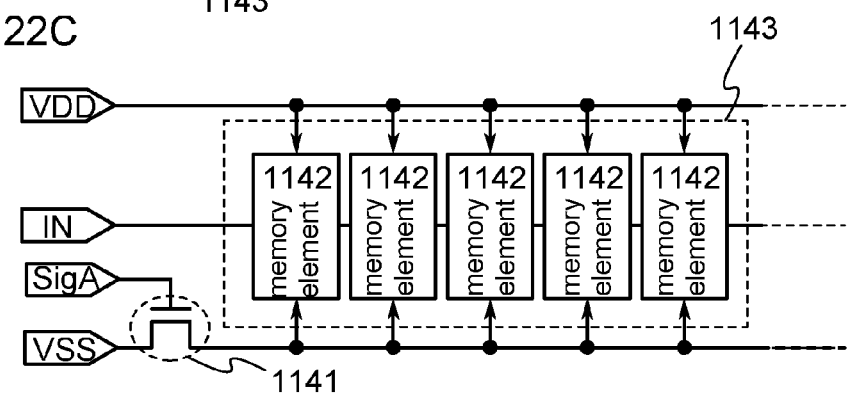

A switching element is provided between a memory element group and a node to which a power supply potential VDD or a power supply potential VSS is supplied, as shown in FIG. 22B or FIG. 22C, so that the power supply can be stopped. Circuits shown in FIGS. 22B and 22C are described below.

FIGS. 22B and 22C each show a configuration example of a memory circuit which includes a transistor in which an oxide semiconductor is used as an active layer as a switching element for controlling supply of a power supply potential to a memory element.

The memory device shown in FIG. 22B includes a switching element 1141 and a memory element group 1143 including a plurality of memory elements 1142. Specifically, as each of the memory elements 1142, the memory element described in Embodiment 4 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 22B, a transistor in which an active layer is formed using an oxide semiconductor is used as the switching element 1141, and the switching of the transistor is controlled by a signal Sig A supplied to a gate electrode thereof.

Note that FIG. 22B shows the configuration in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 22B, the switching element 1141 may control the supply of the low-level power supply potential VSS.

In FIG. 22C, an example of a memory device in which each of the memory elements 1142 included in the memory element group 1143 is supplied with the low-level power supply potential VSS via the switching element 1141 is shown. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

A central processing unit (CPU) can be formed by applying any of the semiconductor devices in Embodiments 1 to 6 as part thereof, so that the integration degree of the CPU can be increased. Further, the power consumption of the CPU can be reduced.

This embodiment can be implemented by being combined as appropriate with any of the above-described embodiments.

[Embodiment 8]

In this embodiment, a liquid crystal display device manufactured with a transistor including an oxide semiconductor layer described in any of Embodiments 1 to 5 is described. Note that an example in which one embodiment of the present invention is applied to a liquid crystal display device is described in this embodiment; however, the present invention is not limited to this embodiment. For example, application of one embodiment of the present invention to an electroluminescence (EL) display device is readily conceived by those skilled in the art.

FIG. 23 is a circuit diagram of an active matrix liquid crystal display device. The liquid crystal display device includes source lines SL_1 to SL_a, gate lines GL_1 to GL_b, and a plurality of pixels 2000. Each pixel 2000 includes a transistor 2030, a capacitor 2020, and a liquid crystal element 2010. The plurality of pixels 2000 with such a structure forms a pixel portion of the liquid crystal display device. Note that a "source line SL" and a "gate line GL" simply refer to a source line and a gate line, respectively.

The transistor 2030 is the transistor described in any of Embodiments 1 to 5. The occupied area of the transistor is reduced by application of the transistor which is one embodiment of the present invention, so that a display device with high aperture ratio can be obtained.

The gate line GL is connected to a gate of the transistor 2030, the source line SL is connected to a source of the transistor 2030, and a drain of the transistor 2030 is connected to one capacitor electrode of the capacitor 2020 and one pixel electrode of the liquid crystal element 2010. The other capacitor electrode of the capacitor 2020 and the other pixel electrode of the liquid crystal element 2010 are connected to a common electrode. The common electrode can be formed using the same layer and the same material as the gate line GL.

Further, the gate line GL is connected to a gate driver circuit. The gate driver circuit may include the transistor described in any of Embodiments 1 to 5. The size of the transistor can be reduced by application of the transistor which is one embodiment of the present invention, so that frame area of the transistor can be reduced. Further, power consumption can be reduced.

The source line SL is connected to a source driver circuit. The source driver circuit may include the transistor described in any of Embodiments 1 to 5. The size of the transistor can be reduced by application of the transistor which is one embodiment of the present invention, so that frame area of the transistor can be reduced. Further, power consumption can be reduced.

Note that either or both of the gate driver circuit and the source driver circuit may be formed over a separately prepared substrate and connected using a method such as chip on glass (COG), wire bonding, or tape automated bonding (TAB).

Since a transistor is easily broken by static electricity or the like, a protection circuit is preferably provided. The protection circuit is preferably formed using a nonlinear element.

On application of a potential that is higher than the threshold voltage of the transistor 2030 to the gate line GL, electric charge supplied from the source line SL flows as a drain current of the transistor 2030 and is accumulated in the capacitor 2020. After charging for one row, the transistors 2030 in the row are turned off and voltage application from the source line SL stops; however, a necessary voltage can be kept by the electric charge accumulated in the capacitors 2020. Then, the capacitors 2020 in the next row are charged. In this manner, charging for the first row to the b-th row is carried out.

In the case where an oxide semiconductor film is used as the semiconductor film in which the channel formation region of the transistor 2030 is formed, a period during which the voltage is held can be longer. By this effect, the display rewriting frequency can be reduced in the case of displaying an image with little motion (including a still image); accordingly, further reduction of the power consumption is possible. In addition, the capacitance of the capacitor 2020 can be further reduced, so that power consumption needed for charging can be reduced.

As described above, according to one embodiment of the present invention, a liquid crystal display device with high aperture ratio, high reliability, and low power consumption can be obtained.

This embodiment can be implemented in appropriate combination with the other embodiments.

[Embodiment 9]

In this embodiment, examples of electronic devices to which any of Embodiments 1 to 8 is applied are described.

Figure 24A:
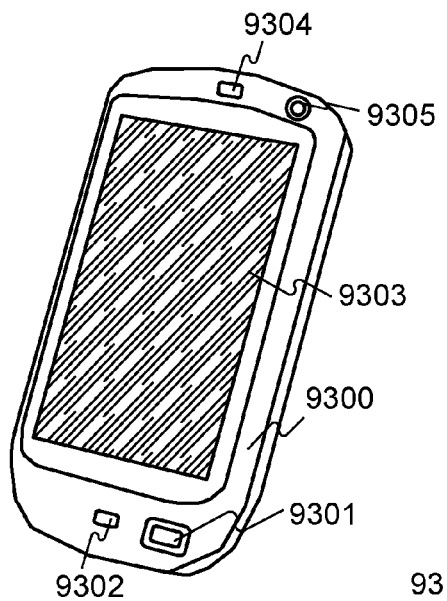
FIGS. 24A to 24C are perspective views each of which shows an example of an electronic device according to one embodiment of the present invention.

FIG. 24A shows a portable information terminal. The portable information terminal includes a housing 9300, a button 9301, a microphone 9302, a display portion 9303, a speaker 9304, and a camera 9305, and has a function as a mobile phone. One embodiment of the present invention can be applied to the display portion 9303 and the camera 9305. Although not shown, one embodiment of the present invention can also be applied to an arithmetic unit, a wireless circuit, or a memory circuit inside the main body.

Figure 24B:
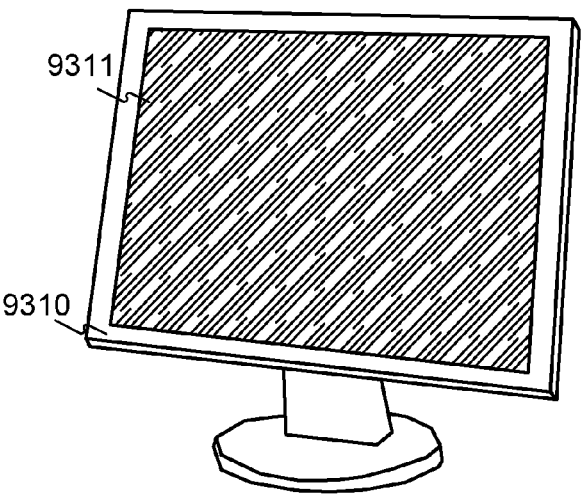

FIG. 24B shows a display. The display includes a housing 9310 and a display portion 9311. One embodiment of the present invention can be applied to the display portion 9311. When one embodiment of the present invention is employed, a display having low power consumption can be provided even in the case where the size of the display portion 9311 is increased.

Figure 24C:
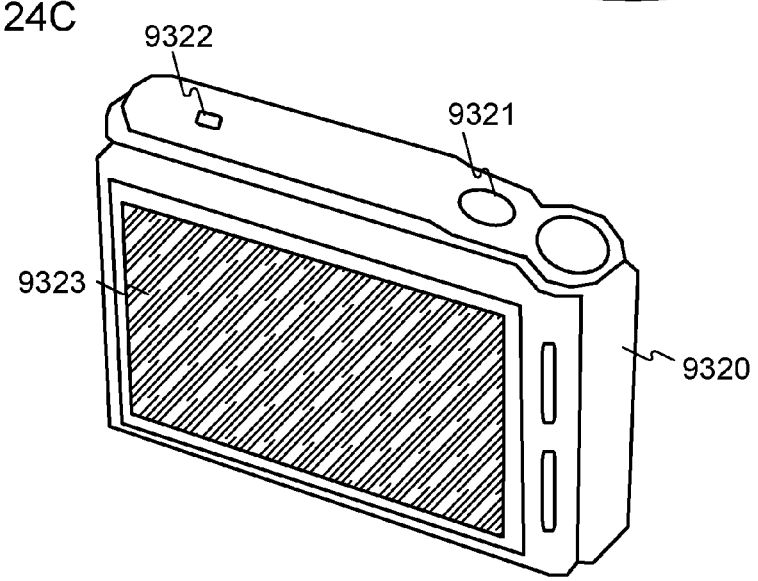

FIG. 24C shows a digital still camera. The digital still camera includes a housing 9320, a button 9321, a microphone 9322, and a display portion 9323. One embodiment of the present invention can be applied to the display portion 9323. Although not shown, one embodiment of the present invention can also be applied to a memory circuit or an image sensor.

When one embodiment of the present invention is employed, cost and power consumption of an electronic device can be reduced.

This embodiment can be implemented in appropriate combination with the other embodiments.

This application is based on Japanese Patent Application serial No. 2011-047759 filed with Japan Patent Office on Mar. 4, 2011, the entire contents of which are hereby incorporated by reference.

What is claimed is:

1. A semiconductor device comprising:
   a gate electrode including a pair of first protrusions and a second protrusion provided between the pair of first protrusions;
   a gate insulating film over the gate electrode;
   a semiconductor film which is in contact with the gate insulating film and overlaps with the pair of first protrusions and the second protrusion; and
   a pair of electrodes which is in contact with the semiconductor film and overlaps with the pair of first protrusions,
   wherein the second protrusion is wider than each of the pair of first protrusions,
   wherein side edges of the semiconductor film are on outer sides of top surfaces of the pair of first protrusions in a direction of a channel width of the semiconductor film, and
   wherein side edges of the pair of electrodes are on outer sides of top surfaces of the pair of first protrusions in the direction of the channel width of the semiconductor film.

2. The semiconductor device according to claim 1, wherein a plurality of pairs of first protrusions is provided in the direction of the channel width of the semiconductor film.

3. A semiconductor device according to claim 1, wherein a plurality of second protrusions is provided in a direction of a channel length of the semiconductor film.

4. A semiconductor device according to claim 1,
   wherein the gate electrode comprises a first region including the pair of first protrusions and the second protrusion, and a second region which is in contact with the first region,
   wherein the first region and the second region are formed using different conductive materials, and
   wherein a difference in work function between the conductive material forming the first region and the conductive material forming the second region is less than or equal to 0.6 eV.

5. A semiconductor device according to claim 1, wherein the gate electrode is formed using a multi-tone mask.

6. The semiconductor device according to claim 1, wherein an effective channel length and an effective channel width formed in the semiconductor film are three times or more an apparent channel length and an apparent channel width, respectively, which are a distance between the pair of electrodes when seen from a top.

7. The semiconductor device according to claim 1, wherein the semiconductor film is an oxide semiconductor film.

8. The semiconductor device according to claim 1, wherein the semiconductor device is one of a portable information terminal, a display, and a digital still camera.

9. A semiconductor device comprising:
   a gate electrode including a plurality of pairs of first protrusions and a second protrusion provided between the plurality of pairs of first protrusions;
   a gate insulating film over the gate electrode;
   a semiconductor film which is in contact with the gate insulating film and overlaps with the plurality of pairs of first protrusions and the second protrusion; and
   a pair of electrodes which is in contact with the semiconductor film and overlaps with the plurality of pairs of first protrusions,
   wherein the second protrusion is wider than each of the plurality of pairs of first protrusions,
   wherein one of side edges of the semiconductor film in a direction of a channel width are provided over top surfaces of the plurality of pairs of first protrusions, and the other of the side edges of the semiconductor film in the direction of the channel width is provided over top surfaces of a pair of first protrusions which is different from the one of the plurality of pairs of first protrusions, and
   wherein one of side edges of the pair of electrodes in the direction of the channel width are provided over top surfaces of the plurality of pairs of first protrusions, and the other of the side edges of the pair of electrodes in the direction of the channel width is provided over top surfaces of a pair of first protrusions which is different from the one of the plurality of pairs of first protrusions.

10. A semiconductor device according to claim 9, wherein a plurality of second protrusions is provided in a direction of a channel length of the semiconductor film.

11. A semiconductor device according to claim 9,
   wherein the gate electrode comprises a first region including the pair of first protrusions and the second protrusion, and a second region which is in contact with the first region,
   wherein the first region and the second region are formed using different conductive materials, and wherein a difference in work function between the conductive material forming the first region and the conductive material forming the second region is less than or equal to 0.6 eV.

12. A semiconductor device according to claim 9, wherein the gate electrode is formed using a multi-tone mask.

13. The semiconductor device according to claim 9, wherein an effective channel length and an effective channel width formed in the semiconductor film are three times or more an apparent channel length and an apparent channel width, respectively, which are a distance between the pair of electrodes when seen from a top.

14. The semiconductor device according to claim 9, wherein the semiconductor film is an oxide semiconductor film.

15. The semiconductor device according to claim 9, wherein the semiconductor device is one of a portable information terminal, a display, and a digital still camera.

* * * * *